(12) United States Patent
Sato et al.

(10) Patent No.: US 6,532,579 B2
(45) Date of Patent: Mar. 11, 2003

(54) SEMICONDUCTOR INTEGRATED CIRCUIT AND DESIGN METHOD AND MANUFACTURING METHOD OF THE SAME

(75) Inventors: Masayuki Sato, Tasasaki (JP); Kunio Uchiyama, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/832,017

(22) Filed: Apr. 11, 2001

(65) Prior Publication Data

US 2001/0044918 A1 Nov. 22, 2001

(30) Foreign Application Priority Data

Apr. 18, 2000 (JP) ........................................ 2000-117001

(51) Int. Cl.⁷ ................................................ G06F 9/45
(52) U.S. Cl. ............................................ 716/8; 716/10
(58) Field of Search ....................................... 716/8, 10

(56) References Cited

U.S. PATENT DOCUMENTS 5,309,371 A  *  5/1994  Shikata et al. ................ 716/10
5,991,907 A  * 11/1999  Stroud et al. ............... 714/725

* cited by examiner

*Primary Examiner*—Vuthe Siek
*Assistant Examiner*—Brandon Bowers

(57) ABSTRACT

A system for testing a semiconductor integrated circuit includes a plurality of programmable logic cells (LCL) having storage elements (MC1 through MC4) and each capable of outputting an arbitrary logic output corresponding to an input according to information stored in each storage element are spread over areas other than circuit blocks (CPU, ROM, etc.) on a semiconductor chip without space. Each in-chip circuit block is tested by use of the programmable logic cell.

4 Claims, 17 Drawing Sheets

SEMICONDUCTOR INTEGRATED CIRCUIT AND DESIGN METHOD AND MANUFACTURING METHOD OF THE SAME

BACKGROUND OF THE INVENTION

The present invention relates to a technology effective for application to a method of testing, designing and manufacturing a semiconductor integrated circuit like a logic integrated circuit, and to a technology effective for application to a so-called system LSI (Large-Scale Integration) wherein, for example, a custom logic circuit having a function desired by a user is added to a one-chip microcomputer.

SUMMARY OF THE INVENTION

In a logic LSI, a so-called scan path system for serially connecting flip-flops constituting an internal sequence circuit, and inputting test patterns to thereby test whether the logic of an internal circuit is normal, has been adopted for the purpose of a test on the internal circuit. In recent years, a logic LSI with a BIST (Built-In Self-Test) system provided thereinside with a test circuit for generating test patterns has also been provided as an alternative to the scan path system.

In addition to the drawback that since the test patterns are serially inputted, a test time interval increases upon the examination of the scan path system, a problem arises in that as the logic scale of an LSI increases as in recent years, the number of test patterns for enhancing defect detection increases exponentially, thereby incurring an increase in the load on a tester for generating test patterns and a great rise in the cost of the tester, and the cost per chip also increases because the time required to test one LSI also increases.

On the other hand, since a random pattern generator is used to form test patterns, it is hard to say that the sufficient rate of defect detection is assured upon the BIST system test. Further, since it is connected to a tester to issue instructions upon the test, the load on the tester produces the need for an expensive tester during at least a test process, so that cost performance cannot be enhanced sufficiently. An LSI equipped with a BIST circuit has a problem in that a chip size increases by the BIST circuit itself and the cost rises, and yields are reduced due to the occurrence of a defect by the BIST circuit per se.

An object of the present invention is to provide a semiconductor integrated circuit wherein a self-examining test circuit can be configured without an increase in chip size.

Another object of the present invention is to provide the technology of manufacturing a semiconductor integrated circuit capable of testing an internal circuit without having to use an expensive tester.

A further object of the present invention is to provide the technology of designing a semiconductor integrated circuit which does not cause a reduction in yield due to the occurrence of a defect by the circuit per se.

The above, other objects and novel features of the present invention will become apparent from the description of the present specification and the accompanying drawings.

Summaries of typical ones of the inventions disclosed in the present applications will be explained as follows:

A semiconductor integrated circuit according to the present invention is one wherein a plurality of programmable logic cells having storage elements and each capable of outputting an arbitrary logic output corresponding to an input according to information stored in each storage element are provided in areas other than circuit blocks on a semiconductor chip so as to spread over the semiconductor chip without space, for example, or one wherein a first programmable logic unit and a second programmable logic unit which respectively comprise a plurality of programmable logic cells having storage elements and each capable of outputting an arbitrary logic output corresponding to an input according to information stored in each storage element, are placed so as to interpose circuit blocks placed on a semiconductor chip therebetween, and the first programmable logic unit and the second programmable logic unit are capable of accessing in parallel.

In a logic LSI like a system LSI configured under a CBIC (Cell Base IC) system by an arrangement of macrocells such as a CPU core, a RAM, etc., free spaces have heretofore been defined between respective circuit blocks. The total amount thereof reaches 5 to 10% of a chip even on the average and might reach near 20% in the worst case. Converting it to the number of logic gates could yield the creation of gates approximates to four thousand to one hundred thousand in number. Therefore, since a test circuit for examining each in-chip circuit block can be configured using each of programmable logic cells provided in such free spaces, according to the above means, a self-examining test circuit can be formed without an increase in chip size, and a semiconductor integrated circuit capable of performing a non-defective product decision without using an expensive tester can be implemented. Since the test circuit is provided inside the chip, a circuit block to be tested is directly tested without being via other circuit blocks, and even a local circuit lying inside the circuit block can directly be tested. It is also possible to effect a sufficient test on an on-chip CPU or the like which have heretofore encountered difficulties in executing the sufficient test.

Preferably, a decoder circuit capable of selecting any of the plurality of programmable logic cells, and amplifier circuits each of which writes and reads information into and from each storage element in the programmable logic cell selected by the decoder circuit, are placed at a peripheral edge portion of the semiconductor chip. Thus, an arbitrary logic circuit can be added after the use of internal programmable logic cells in each of individual chip units.

Further, preferably, the programmable logic cell constitutes a test circuit for examining at least one of the circuit blocks. Thus, a test circuit is constructed by use of internal programmable logic cells in each of individual chip units to thereby make it possible to test the circuit blocks.

The programmable logic cell may preferably constitute a memory circuit accessible by any of the circuit blocks. Thus, the overhead of the circuit can be reduced, the chip size can be reduced, and the storage capacity of the entire on-chip system can be increased.

The programmable logic cell may preferably constitute a repairing circuit for mending a faulty portion which exists in any of the circuit blocks. It is thus possible to improve the yield of the chip.

Further, the programmable logic cell may preferably comprise a plurality of programmable logic units which respectively have $2^n$ memory cells alternatively selected according to combinations of n sets (where n is a positive integer) with signals respectively set to positive-phase and a negative-phase and which are respectively configured so as to output the positive-phase and negative-phase signals according to data stored in each selected memory cell, variable wiring means provided with a plurality of signal lines for allowing connections to other programmable logic units, and switch elements capable of connecting or cutting off between the signal lines which intersect each other, and a wiring connection state storage unit which stores the state of each switch element of the variable wiring means therein. Owing to the setting of the input and output of each programmable logic circuit as differential signals, a noise-resistant semiconductor integrated circuit can be implemented even when the circuit is lowered in voltage.

A method of designing a semiconductor integrated circuit, according to the present invention is one which comprises the steps of, upon DA (Design Automation)-based design, laying out a plurality of programmable logic cells having storage elements and each capable of outputting an arbitrary logic output corresponding to an input according to information stored in each storage element so as to spread over the entire semiconductor chip, thereafter determining the layout of each of circuit blocks each having a desired function, and laying out each of the circuit blocks in a layout-determined area on the chip with its replacement by the programmable logic cell.

According to the above-described means, the layout of the circuit blocks each having the desired function can be determined in exactly the same manner as conventional without bearing the pre-laid out programmable logic cells in mind. Further, a test circuit for examining each in-chip circuit block can be configured by use of the programmable logic cell left between the laid-out circuit blocks. Therefore, a semiconductor integrated circuit wherein a self-examining test circuit can be configured, can be obtained without an increase in chip size.

A method of manufacturing a semiconductor integrated circuit, according to the present invention is one which comprises the steps of laying out a plurality of programmable logic cells having storage elements and each capable of outputting an arbitrary logic output corresponding to an input according to information stored in each storage element so as to spread over the entire semiconductor chip, thereafter determining the layout of each of circuit blocks each having a desired function, laying out each of the circuit blocks in a layout-determined area on the chip with its replacement by the programmable logic cell to thereby form the semiconductor integrated circuit, thereafter examining the programmable logic cells, forming a test circuit for checking at least one of the circuit blocks by using the programmable logic cell judged to be normal, and examining each circuit block by the test circuit to thereby remove a defective product.

According to the above-described means, the programmable logic cells left between the laid-out circuit blocks are examined. The test circuit for examining each of the circuit blocks is configured by use of the cell judged to be normal and performs testing. Therefore, a semiconductor integrated circuit in which a self-examining test circuit can be configured, can be implemented without an increase in chip size. Further, no yield is reduced due to the occurrence of a failure in the test circuit.

Further, after the examination of the circuit blocks by the test circuit configured by the programmable logic cell has been completed, a semiconductor integrated circuit judged to be defective, based on the result of examination is removed. The programmable logic cell having constituted the test circuit may have a make up of a logic circuit like a custom logic circuit having a function desired by a user. Thus, a semiconductor integrated circuit low in overhead can be implemented. After the examination of the circuit blocks by the test circuit has been finished, a portion having a defect detected by the examination may be repaired by the programmable logic cell having constituted the test circuit or by the programmable logic cell other than the same. Thus, since an LSI, which has heretofore been removed as a defective product, can be regarded as a non-defective product, the yield of the LSI can be enhanced.

DESCRIPTION OF THE PREFERRED EMBODIMENTS

Preferred embodiments of the present invention will hereinafter be described with reference to the accompanying drawings.

Figure 1:
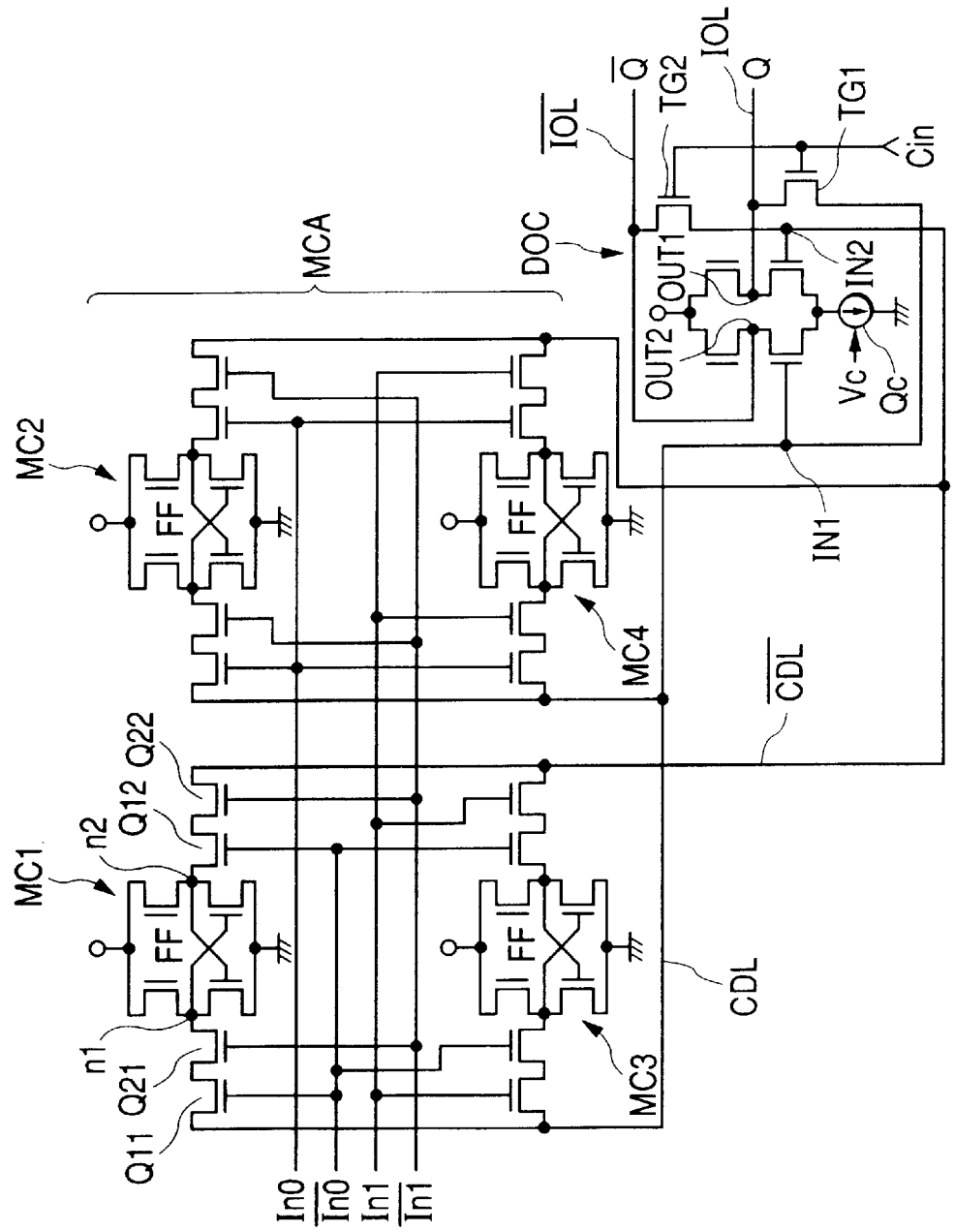
FIG. 1 is a circuit diagram showing a first embodiment of a programmable logic circuit employed in a semiconductor integrated circuit according to the present invention.
Figure 2:
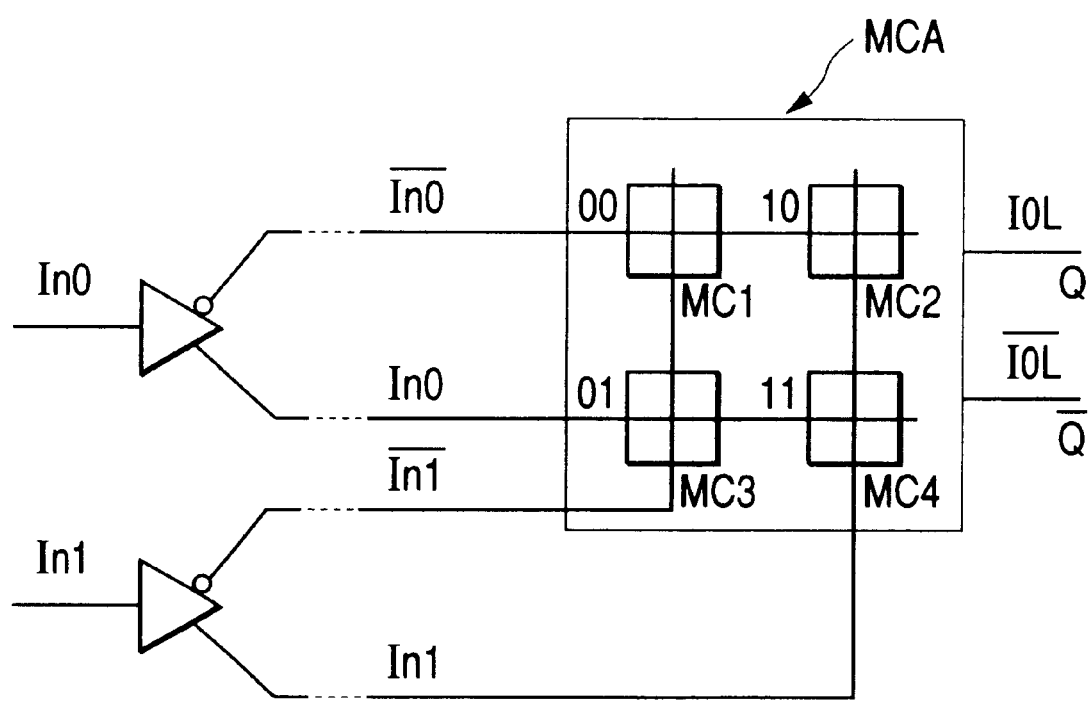
FIG. 2 is a conceptual diagram of the programmable logic circuit showing the embodiment shown in FIG. 1.

FIG. 1 is a circuit diagram showing a first embodiment of a variable or programmable logic circuit according to the present invention, and FIG. 2 is a conceptual diagram thereof, respectively. The programmable logic circuit shown in FIG. 1 is a two-input logic circuit having four memory cells and one complementary output circuit. In FIG. 1, MC1, MC2, MC3 and MC4 respectively indicate memory cells having configurations substantially similar to the memory cells constituting the known SRAM (Static Random Access Memory). DOC indicates a data output circuit comprising a differential amplifier circuit. TG1 and TG2 respectively indicate input transfer gates for respectively supplying write data to the memory cells MC1 through MC4. Signals equivalent to word select signals employed in a normal SRAM are supplied to a logic setting memory array MCA comprising the four memory cells MC1 through MC4 as differential input signals In0, /In0, ($\overline{In0}$), In1 and /In1 ($\overline{In1}$).

Owing to the setting of the input signals to the logic setting memory array MCA as the differential signals in this way, a logic circuit resistant to noise can be implemented even when a signal level is reduced due to a voltage reduction of a semiconductor integrated circuit. It is also unnecessary to provide a decoder for selecting one of the memory cells MC1 through MC4. When a programmable logic circuit to be noted is a circuit to which signals are directly inputted from external terminals, signals from buffers BFF0 and BFF1 for outputting positive-phase and negative-phase signals according to input signals In0 and In1 are supplied as shown in FIG. 2. On the other hand, when the programmable logic circuit to be noted is a circuit to which a signal produced from another programmable logic circuit is inputted, differential signals outputted from another programmable logic circuit having a configuration similar to FIG. 1 are inputted as they are.

The memory cells MC1 through MC4 constituting the programmable logic circuit according to the present embodiment are respectively different from the memory cells constituting the known SRAM in that each SRAM memory cell is provided with a pair of selection MOSFETs, whereas the memory cells employed in the present embodiment are respectively provided with two pairs of selection MOSFETs. Namely, the memory cells MC1 through MC4 constituting the programmable logic circuit according to the present embodiment respectively comprise a flip-flop circuit FF in which input/output terminals of two inverters are cross-connected, and serial-mode selection MOSFETs Q11, Q12, Q21, Q22 respectively connected to two input/output nodes n1 and n2 of the flip-flop circuit FF.

The flip-flop circuit FF may be one wherein input/output terminals of two CMOS inverters comprised of P channel and N channel MOSFETs are cross-connected. Alternatively, the flip-flop circuit FF may be one wherein input/output terminals of two inverters in which depletion type MOSFETs or load elements such as polysilicon resistors are provided on the source voltage Vcc side of N channel MOSFETs, are cross-connected.

The programmable logic circuit according to the present embodiment is configured so that combined signals of the input signals In0 or /In0 and In1 or /In1, i.e., any of In0, In1; In0, /In1; /In0, In1; and /In0, /In1 is applied to any of gate terminals of the selection MOSFETs Q11, Q12, Q21, Q22 of the four memory cells MC1 through MC4. The input/output nodes n1 and n2 of the flip-flop circuits FF of the memory cells MC1 through MC4 are respectively configured so as to be capable of connecting to common data signal lines CDL and /CDL ($\overline{CDL}$) whose ends are connected to a pair of input nodes IN1 and IN2 of the data output circuit DOC, through the selection MOSFETs Q11 and Q12, and Q21 and Q22.

Input transfer gates TG1 and TG2 comprised of MOSFETs, having gate terminals to which a common input control signal Cin is applied, are connected between the common data signal lines CDL and /CDL ($\overline{CDL}$) and input/output signal lines IOL and /IOL ($\overline{IOL}$) connected to their corresponding output nodes OUT1 and OUT2 of the data output circuit DOC. The input transfer gates TG1 and TG2 are not limited to MOSFETs and may comprise logic gate circuits such as AND gates or the like. The data output circuit DOC is not limited to such a differential amplifier circuit either as shown in FIG. 1. When the data output circuit DOC comprises such a differential amplifier circuit as shown in FIG. 1, a constant current MOSFET Qc may preferably be configured such that a current is cut off by, for example, a method of reducing a gate bias voltage Vc to 0V upon the input of data at which the input transfer gates TG1 and TG2 are respectively brought to a conducting state by the input control signal Cin.

Figure 3:
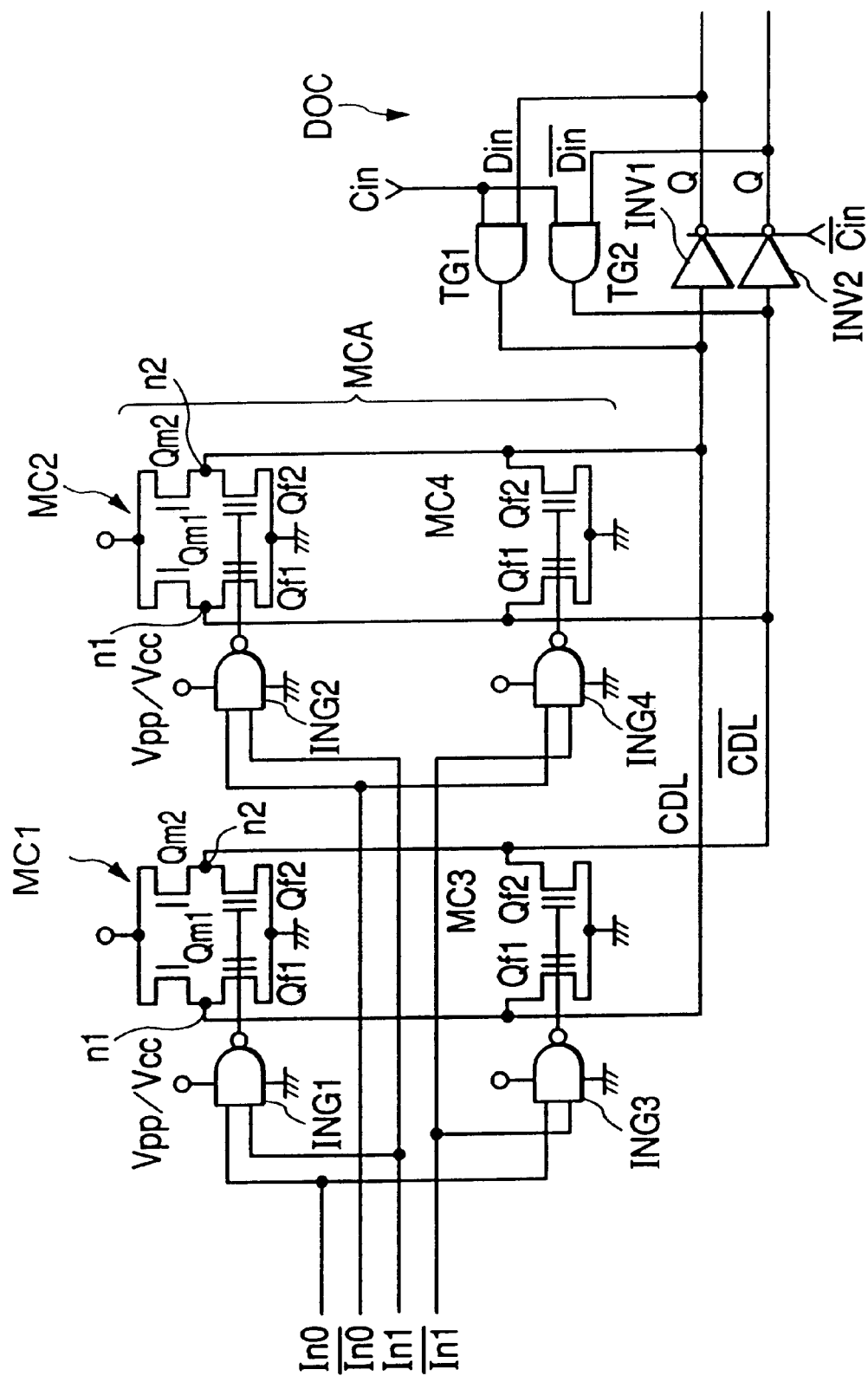
FIG. 3 is a circuit diagram illustrating a second embodiment of a programmable logic circuit employed in a semiconductor integrated circuit according to the present invention.

FIG. 3 shows another embodiment of the programmable logic circuit.

In the present embodiment, each of the memory cells MC1 through MC4, which constitute the programmable logic circuit, is one configured by use of a memory or storage element employed in a non-volatile memory like a flash memory.

Described specifically, the memory cells MC1 and MC2 respectively comprise first inverters each of which is provided between a source voltage Vcc and a ground point and comprises a load element Qm1 comprised of a normal MOSFET and a non-volatile storage element Qf1 comprised of a MOSFET having a floating gate, both of which are connected in series, second inverters each of which is provided between the source voltage Vcc and the ground point and comprises a load element Qm2 comprised of a normal MOSFET and a non-volatile storage element Qf2 comprised of a MOSFET having a floating gate, both of which are connected in series, and NAND gates INGi (where i=1, 2, 3 and 4) each of which receives any of combined signals of input signals In0 or /In0 and In1 or /In1, i.e., In0, In1; In0, /In1; /In0, In1; and /In0, /In1. The memory cells MC3 and MC4 respectively comprise pairs of inverters wherein the transistors Qm1 and Qm2 of the memory cells MC1 and MC2 are respectively connected to the drains of non-volatile storage elements Qf1 and Qf2 so that they serve as common load elements respectively. Thus, an advantage is obtained in that since the programmable logic circuit shown in FIG. 3 can be reduced in constituent element number as compared with the programmable logic circuit shown in FIG. 1, it can be reduced in its occupied area.

Further, connecting nodes n1 of the transistors Qm1 and Qf1 of the memory cells MC1 through MC4 are respectively connected to a common data signal line CDL, whereas connecting nodes n2 of the transistors Qm2 and Qf2 thereof are respectively connected to a common data signal line /CDL. Writing can be carried out on a complementary basis, i.e., the threshold value of either one of the non-volatile storage elements Qf1 and Qf2 is increased and the threshold value of the other thereof is kept low to thereby allow writing high in reliability. Since data are outputted from a node n1 on the Qf1 side and a node n2 on the Qf2 side as complementary signals even upon output, accurate reading is assured. Incidentally, each of the NAND gates INGi has a source voltage terminal to which the normal source voltage Vcc is applied upon data reading and a voltage Vpp higher than Vcc is applied upon data writing.

A data output circuit DOC comprises two inverters INV1 and INV2. In this case, the respective output inverters INV1 and INV2 may preferably use a so-called clocked inverter each capable of obtaining output high impedance according to an input control signal /Cin ($\overline{\text{Cin}}$). Further, AND gates are used as input transfer gates TG1 and TG2 as an alternative to MOSFETs.

The operation of the programmable logic circuit according to the present embodiment and a method of using it will next be explained. The programmable logic circuit according to the present embodiment can be regarded as a memory array wherein as shown in FIG. 2 and Table 1, the four memory cells MC1 through MC4 respectively set any combinations of two sets of differential signals In0, /In0; In1, /In1 as select signals, and the corresponding memory cell in which the two signals are both rendered high in level, is selected.

TABLE 1

| In0 | In1 | Selected memory cell |
|---|---|---|
| 0 | 0 | MC1 |
| 1 | 0 | MC2 |
| 0 | 1 | MC3 |
| 1 | 1 | MC4 |

Thus, when data are respectively written into the memory cells MC1 through MC4 in advance as shown in the following Table 2, signals outputted from the memory cells MC1 through MC4 respectively result in NANDed (NAND), ANDed (AND), ORed (OR), exclusively-ORed (EOR), NORed (NOR) or exclusively-NORed (ENOR) signals of the input signals In0 and In1.

Namely, the programmable logic circuit according to the present embodiment properly set data to be written into the four memory cells MC1 through MC4 to thereby make it possible to implement the function of a basic logic gate circuit necessary to constitute the logic of a logic LSI. Thus, such a programmable logic circuit is distributively provided over a semiconductor chip in large numbers, and a variable wiring circuit comprising wiring groups for allowing connections between arbitrary programmable logic circuits and switch elements for crossed signal lines is provided on the chip, whereby a field-programmable logic array (hereinafter called "FPLA") capable of constituting arbitrary logic can be

TABLE 2

| MC1 | MC2 | MC3 | MC4 | Logic Output |
|---|---|---|---|---|
| 1 | 1 | 1 | 0 | NAND |
| 0 | 0 | 0 | 1 | AND |
| 0 | 1 | 1 | 1 | OR |
| 0 | 1 | 1 | 0 | EOR |
| 1 | 0 | 0 | 0 | NOR |
| 1 | 0 | 0 | 1 | ENOR |

A specific example of a variable wiring circuit for allowing connections between arbitrary programmable logic circuits where the programmable logic circuit according to the above embodiment is placed on a semiconductor chip in plural form to thereby constitute an FPLA, will next be explained using FIGS. 4 and 5.

Figure 4:
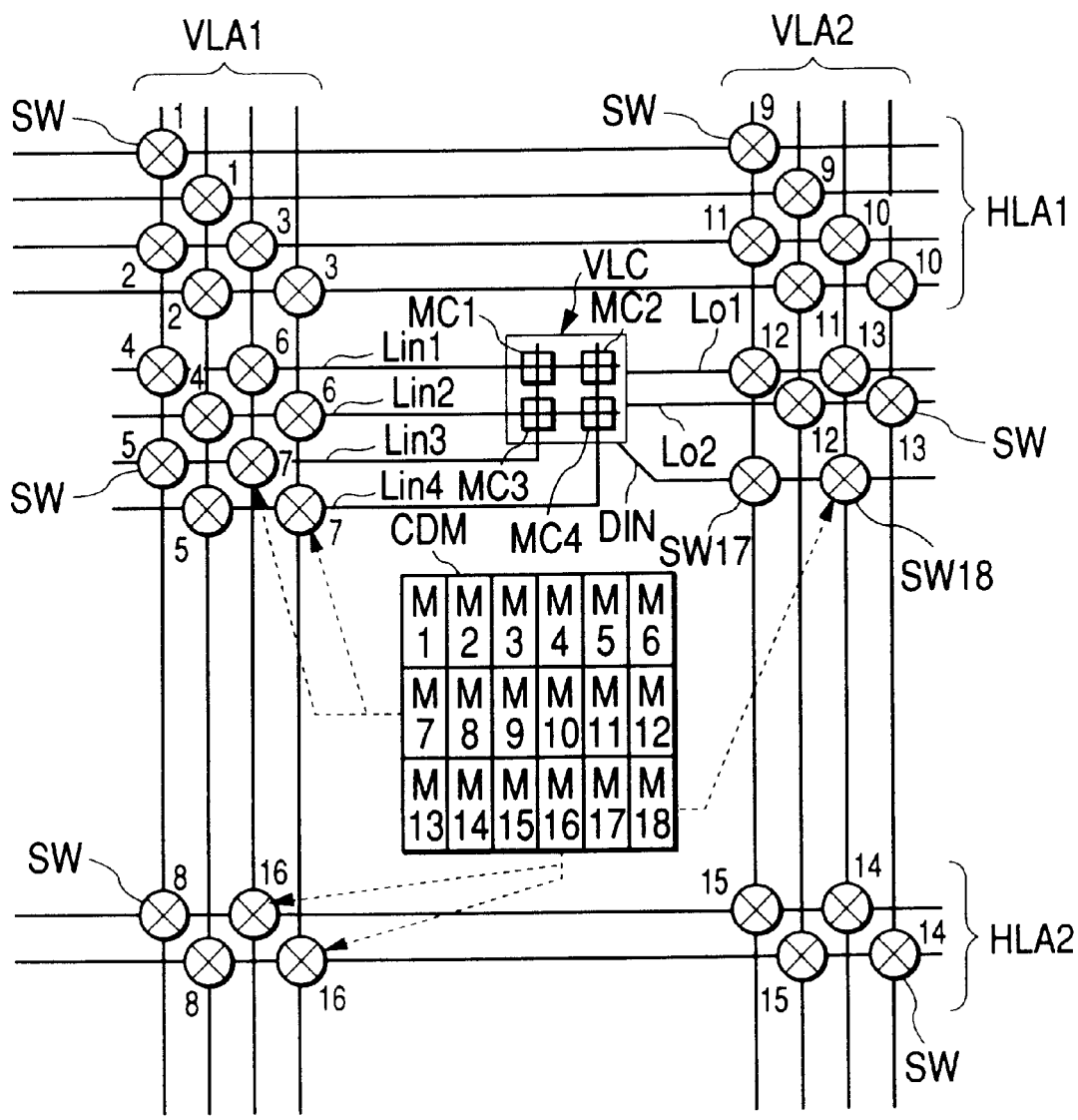
FIG. 4 is a schematic diagram showing an example of a configuration of a variable wiring circuit comprising signal lines and switch elements which allow connections between arbitrary programmable logic circuits.

As shown in FIG. 4, grid- or lattice-shaped wiring areas VLA and HLA are provided on a chip, and the variable or programmable logic circuit (memory cells MC1 through MC4 and data output circuit DOC) VLC and wiring connection information storage circuit or memory CDM according to the above embodiment are laid out in a rectangular area portion surrounded by these wiring areas VLA and HLA. Although not restricted in particular, signal lines are respectively placed in vertical wiring areas VLA1 and VLA2 four by four, and four signal lines and two signal lines are respectively placed in horizontal wiring areas HLA1 and HLA2. Further, switch elements SW capable of electrically connecting between the vertical signal lines and the horizontal signal lines are respectively provided at portions where the vertical wiring areas VLA and the horizontal wiring areas HLA intersect.

Further, switch elements SW capable of electrically connecting between input signals lines Lin1 through Lin4 of the programmable logic circuit VLC and output signal lines Lo1 and Lo2 of the programmable logic circuit VLC are respectively provided even at portions where the input signal lines Lin1 through Lin4 and the vertical wiring area VLA1 intersect and portions where the output signal lines Lo1 and Lo2 and the vertical wiring area VLA2 intersect. The number of the switch elements SW provided in association with one programmable logic circuit is not limited in particular but is thirty four in the present embodiment. Such a circuit as shown in FIG. 4, which comprises the programmable logic circuit VLC, the wiring connection information storage circuit CDM, the wiring areas HLA1 and HLA2, and the switch elements SW capable of electrically connecting between the vertical signal lines and the horizontal signal lines, will be defined as a programmable logic cell LCL.

The wiring connection information storage circuit CDM comprises eighteen memory cells respectively having configurations similar to the memory cells of SRAM. Each of the switch elements SW corresponds to any of the eighteen memory cells lying in the wiring connection information storage circuit CDM and is configured so as to be set to an on state or an off state according to wiring connection information stored in its corresponding memory cell.

Since each programmable logic circuit VLC is configured so as to receive the two positive-phase and negative-phase input signals (differential signals) therein and thereby output the two positive-phase and negative-phase signals similarly in the present embodiment, most of the switch elements SW are set as follows: the states of the two switch elements are set according to information stored in one memory cell lying in the wiring connection information storage circuit CDM. As the only exception, may be mentioned switch elements SW17 and SW18 which allow connections between a data input line DIN for supplying data set to each memory cell of the programmable logic circuit VLC and each signal line in the vertical wiring area VLA. These switch elements SW17 and SW18 are placed in a one-to-one correspondence with one memory cell lying in the wiring connection information storage circuit CDM. In FIG. 4, the numbers assigned within the wiring connection information storage circuit CDM and the numbers assigned to the switch elements have corresponding relation to one another between the same ones.

Figure 5:
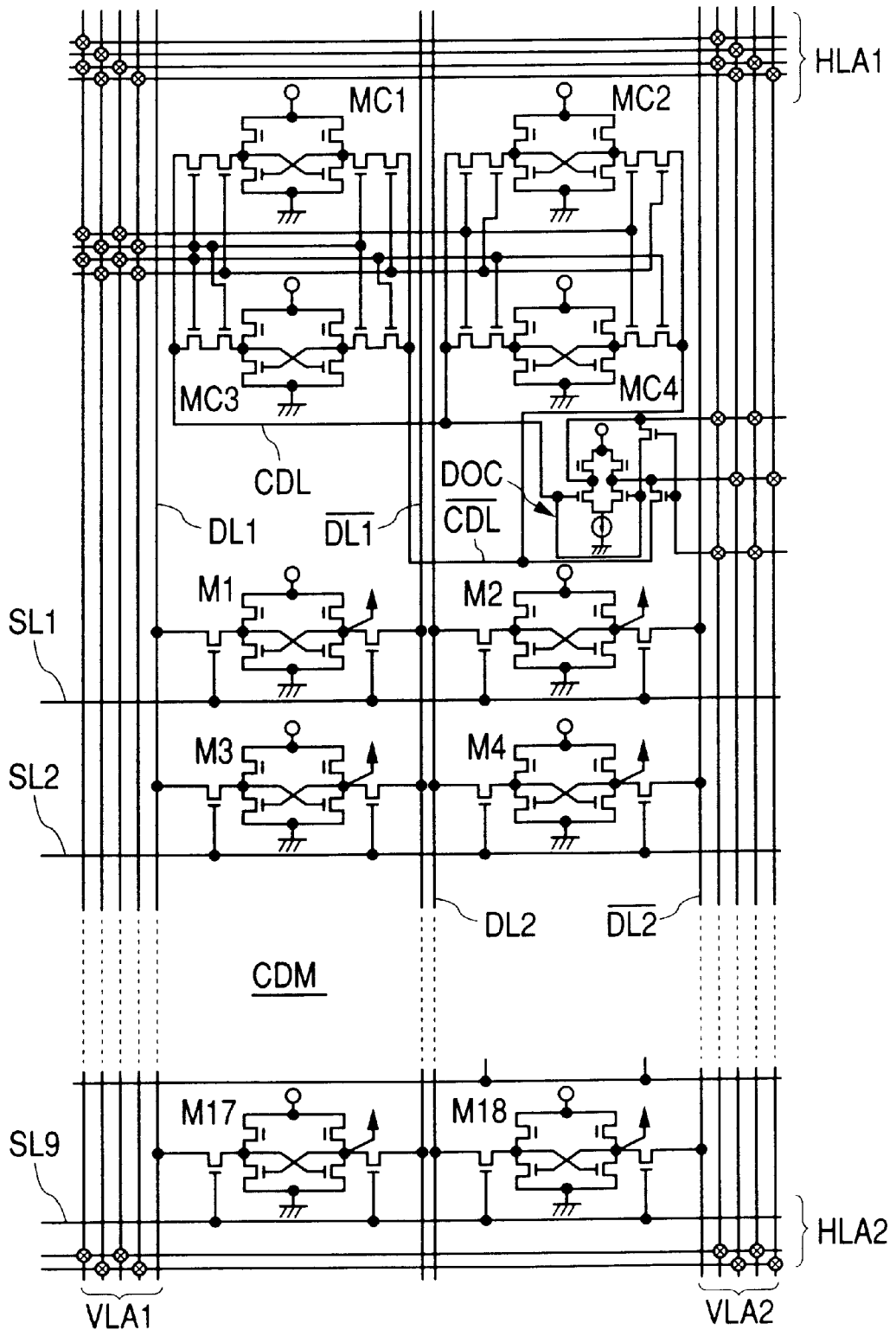
FIG. 5 is a circuit diagram illustrating a specific example of a basic logic cell capable of constituting an FPLA.

A more specific circuit configuration formed by representing the embodiment of FIG. 4 in the form of element levels is shown in FIG. 5. In the drawing, of points where vertical signal lines and horizontal signal lines intersect, points marked with symbols (X marks surrounded by ○) respectively indicate points where switch elements exist. Memory cells M1 through M18 lying in a wiring connection information storage circuit CDM and memory cells MC1 through MC4 lying in a logic setting memory array respectively have the same configurations except that the memory cells M1 through M18 lying in the wiring connection information storage circuit CDM are reduced by one set in the number of selection MOSFETs. Signal lines SL1 through SL9 for respectively selecting the memory cells M1 through M18 lying in the wiring connection information storage circuit CDM are provided separately from the signal lines in the wiring areas VLA and HLA.

Further, the eighteen memory cells M1 through M18 lying in the wiring connection information storage circuit CDM are arranged in two rows in association with the dual-row memory cells MC1 through MC4 lying in the memory array MCA of the programmable logic circuit VLC. Input/output terminals of the memory cells M1, M3, . . . in the left row are respectively connected to common data lines DL1 and /DL1 ($\overline{DL1}$), whereas input/output terminals of the memory cells M2, M4, . . . in the right row are respectively connected to common data lines DL2 and /DL2 ($\overline{DL2}$). Incidentally, the signal lines SL1 through SL9 for respectively selecting the memory cells M1 through M18 lying in the wiring connection information storage circuit CDM are separately provided in the embodiment shown in FIG. 5. It is desirable that when the memory cells MC1 through MC4 lying in the memory array MCA of the programmable logic circuit VLC are made up of the memory cells using such non-volatile storage elements Qf1 and Qf2 as shown in FIG. 3, the memory cells M1 through M18 of the wiring connection information storage circuit CDM are also comprised of memory cells using non-volatile storage elements Qf1 and Qf2 similar to FIG. 3.

Since most of FPLA comprise memory cells each having a configuration similar to the known SRAM memory cell as apparent from FIG. 5, the scale-down technology already developed in SRAM, the know-how on the layout design, etc. can be applied to FPLA using the programmable logic cell LCL employed in the embodiment. Thus, a relatively large number of programmable logic cells can be embedded even in a small space on a semiconductor chip. Incidentally, while the embodiment shown in FIGS. 4 and 5 has shown the case in which the connecting wirings are provided as four pairs as viewed in the vertical direction and three pairs as viewed in the horizontal direction for each programmable logic cell, the number of the wirings is by no means limited to it. A further increase in the number of the wirings and the number of the connecting switches makes it easier to make connections to other programmable logic cells and determine wiring connection information for constituting desired logic.

Figure 6:
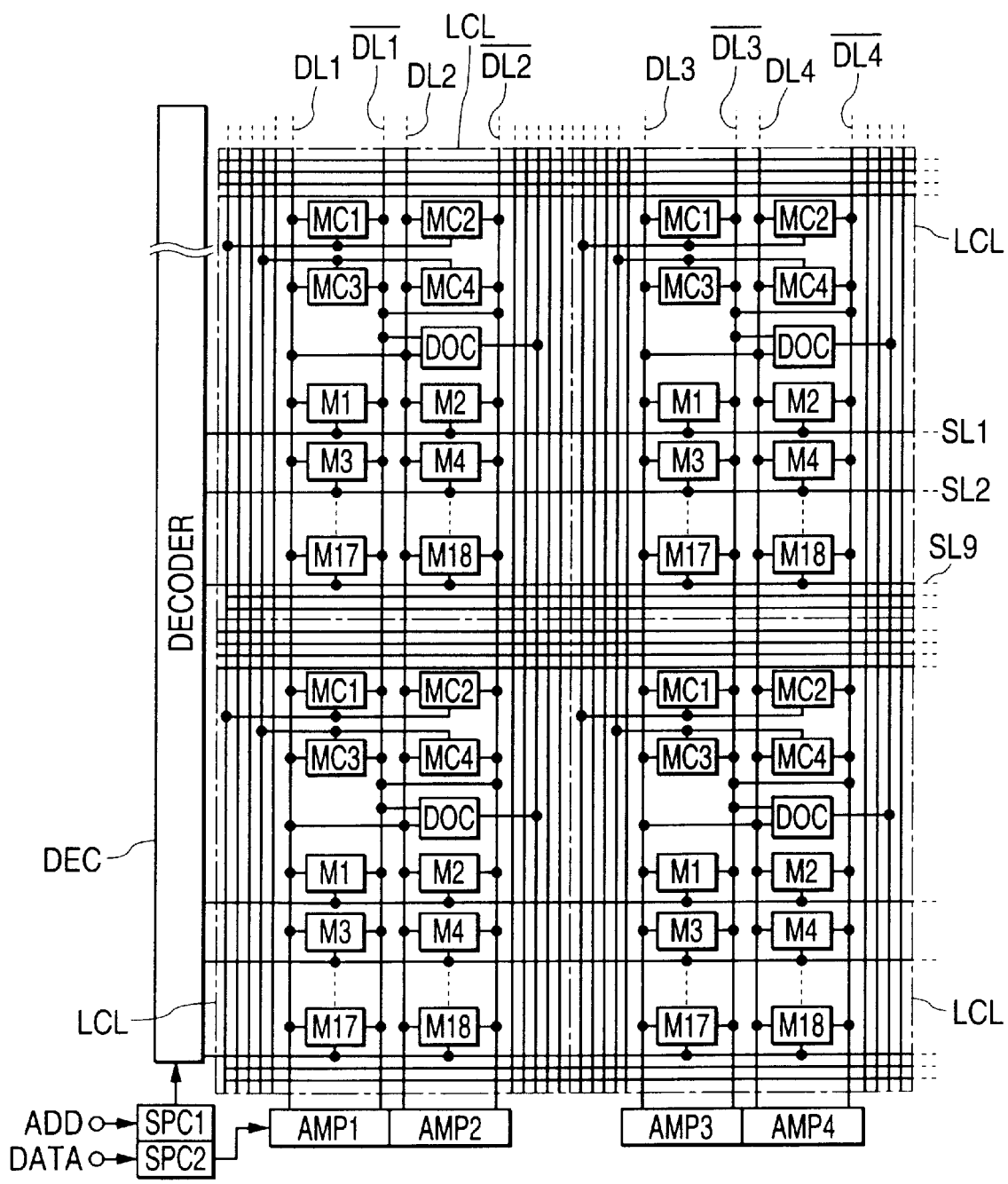
FIG. 6 is a block diagram depicting an example of a configuration of a circuit for a system for writing of information into logic setting memory cells in an FPLA wherein the basic logic cells employed in the embodiment are arranged, and memory cells lying in a wiring connection information storage circuit constituting a variable wiring circuit.

FIG. 6 shows one example of a system for writing wiring connection information into the memory cells M1 through M18 lying in the wiring connection information storage circuit CDM where the programmable logic cells LCL each employed in the above embodiment are placed on their corresponding semiconductor chip in matrix form to thereby constitute an FPLA. In the present embodiment, select signal lines SL1 through SL9 for respectively supplying select signals for the memory cells M1 through M18 lying in each of individual circuits are sequentially placed with respect to a plurality of the programmable logic cells LCL arranged in the horizontal direction as shown in the drawing. One end of these select signal lines SL1 through SL9 is connected to a decoder DEC. However, symbols for indicating switch elements SW are omitted from FIG. 6.

The decoder DEC decodes each of address signals inputted from outside the chip and sets any of the select signal lines SL1 through SL9 to a selection level. Of the memory cells M1 through M18 lying in the plurality of programmable logic cells LCL, input/output terminals of memory cells each connected to the signal line set to the selection level are connected to their corresponding data lines DL1, /DL1; DL2, /DL2; . . . Amplifier circuits AMP1, AMP2, . . . each having a configuration similar to each sense amplifier used in SRAM or the like are connected to one ends of the data lines DL1, /DL1; DL2, /DL2; . . . When write data is inputted to each of the amplifier circuits AMP1, AMP2, . . . from outside, wiring connection information is written into the corresponding memory cell selected at that time.

Although not shown in the drawing, the data lines DL1, /DL1; DL2, /DL2; . . . are provided so as to extend to the side opposite to the amplifier circuits AMP1, AMP2, . . . Input/output terminals of the memory cells M1 through M18 lying in the plurality of programmable logic cells LCL placed on the chip side by side in the vertical direction are commonly connected to the extended data lines DL1, /DL1; DL2, /DL2; . . . Along with it, the decoder DEC is configured so as to correspond even to the plurality of programmable logic cells LCL extending in the vertical direction. The decoder DEC is configured so as to drive one of the select signal lines SL1 through SL9 lying in any of the plurality of programmable logic cells LCL extending in the vertical direction to a selection level.

In the present embodiment as well, address signals ADD to be supplied to the decoder DEC are inputted in serial from one input terminal to save the number of external terminals and converted to parallel signals by a serial-parallel converter SPC1 provided in the chip, followed by supply to the decoder DEC. Similarly, wiring connection information DATA to be written into the memory cells M1 through M18 lying in each programmable logic cell LCL are also serially inputted from one input terminal and converted to parallel signals by a serial-parallel converter SPC2 provided in the chip, followed by supply to the amplifier circuits AMP1, AMP2, . . . .

Figure 7:
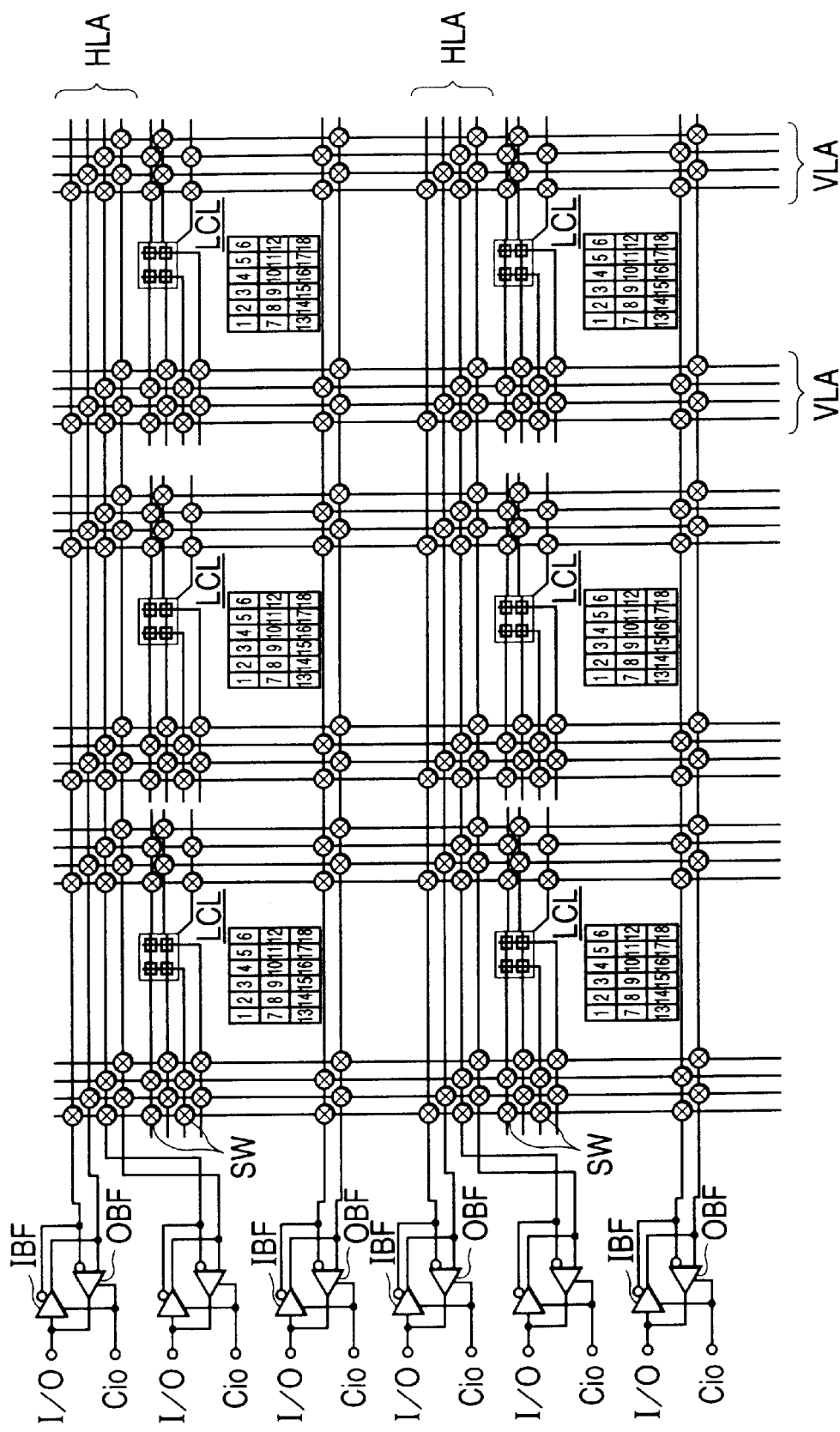
FIG. 7 is a logic configurational diagram showing an example of a configuration of a circuit for a system for inputting and outputting signals to and from each individual logic circuit constructed on an FPLA wherein the basic logic cells employed in the embodiment are configured side by side.

FIG. 7 shows one example of a system for writing logic set information into logic setting memory cells MC1 through MC4 where the programmable logic cells LCL each employed in the above embodiment are placed on a semiconductor chip in matrix form to thereby constitute an FPLA. In the present embodiment as shown in the same drawing, input buffers IBF and output buffers OBF are connected to their corresponding ends on the chip peripheral edge sides, of respective signal lines provided in grid-shaped horizontal wiring areas HLA.

The input buffers IBF respectively receive one input signal from the outside to form positive-phase and negative-phase signals and supply them to internal circuits. The output buffers OBF respectively receive the positive-phase and negative-phase signals supplied from the internal circuits and output signals as single signals each having either the positive phase or negative phase. The reason why information is transferred through the use of the positive-phase and negative-phase two signals within the chip, is that since a reduction in source voltage for an LSI has been put forward in recent years, proper signals can be transferred without being affected by noise even if the source voltage for the chip reaches a low voltage like 3.0V or 1.8V and even though a change in circuit is not made. Further, since the signals supplied to each programmable logic cell LCL are of the positive-phase and negative-phase signals, the input signals are supplied as signals for selecting the logic setting memory cells M1 through M4 as they are in the programmable logic circuit according to the embodiment including the four logic setting memory cells, whereby output signals similar to those having passed through normal two-input logic gates can be obtained at once.

In the present embodiment, although not restricted in particular, the input buffers IBF and output buffers OBF respectively connected to the same signal lines are respectively connected to common external terminals I/0. Further, only either one of the input buffer IBF and the output buffer OBF is activated by a control signal Cio, whereby the number of terminals can be saved through the use of a terminal common to the input and output of the signal. The control signal Cio may be supplied from outside for each external terminal I/0. However, the external terminals I/0 are divided into several groups and the common control signal Cio may be supplied every groups. It is also desirable that the control signal Cio can be supplied from the internal circuits lying in the chip through signals lines in wiring areas VLA and those in the wiring areas HLA. Incidentally, although not shown in the drawing, the input buffers IBF and the output buffers OBF may be configured so as to be connected similarly even to ends on the chip peripheral edge sides, of the respective signal lines provided in the vertical wiring areas VLA.

In the FPLA configured as described above, predetermined data is written into each of the logic setting memory cells MC1 through MC4 lying in each programmable logic cell LCL provided on the chip, and predetermined wiring connection information is written into each of wiring connection information storage memory cells M1 through M18, whereby the states of switch elements SW at intersecting points of the respective signals lines provided in each wring area VLA, can suitably be set. Thus, desired logic can be configured by use of each arbitrary programmable logic cell LCL on the chip.

Figure 8:
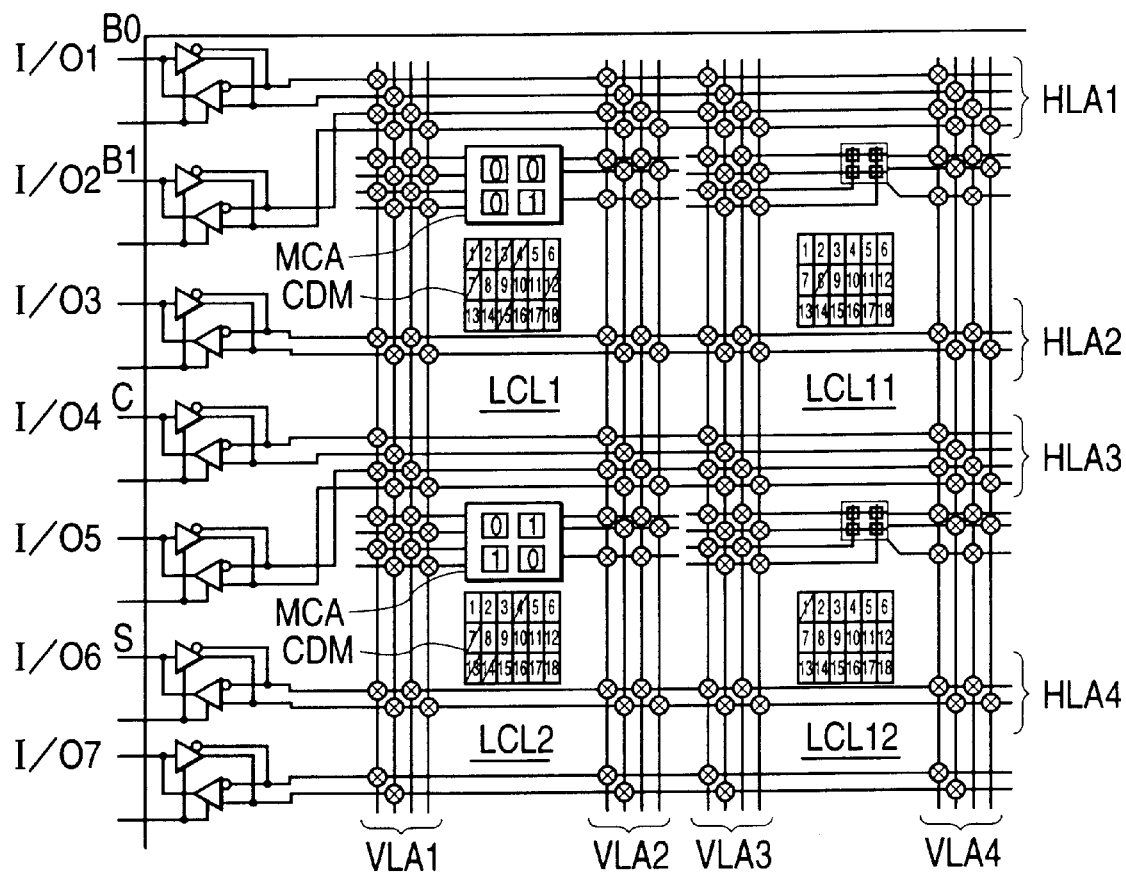
FIG. 8 is an explanatory diagram showing the state connections of signal lines at the time that each half adder is configured as one example of a specific circuit in the FPLA to which the present invention is applied.
Figure 9:
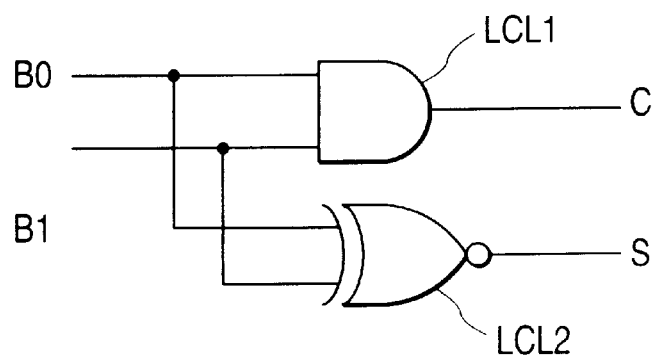
FIG. 9 is a logic configurational diagram representing a half adder in the form of gate circuit levels as one example of a circuit implemented in the connected state shown in FIG. 8.

FIG. 8 shows, as one example, a system for connecting respective signal lines and a system for setting data to each logic setting memory array MCA where in an FPLA having such a configuration as shown in FIG. 7, two programmable logic cells LCL are used to constitute a half adder having such a logic function as shown in FIG. 9, input signals B0 and B1 are supplied from external terminals I/01 and I/02, and a carry signal C and a sum signal S are outputted from external terminals I/04 and I/06.

In FIG. 8, codes of "0" and "1" written into the logic setting memory array MCA respectively indicate data set to four memory cells (MC1 through MC4). It is understood by reference to Table 2 that an AND gate circuit comprises a programmable logic cell LCL1 and an EOR gate circuit comprises a programmable logic cell LCL2, respectively.

On the other hand, diagonally-shaped ones of memory cells (M1 through M18) of each wiring connection information storage circuit or memory CDM respectively indicate those in which their corresponding switches SW are respectively set to an on state according to the writing of data "1" therein, for example. Further, non-diagonally-shaded ones of the memory cells M1 through M18 respectively indicate those in which their corresponding switches SW are respectively set to an on state according to the non-writing of data "0" therein. In FIG. 8, the signals B0 and B1 inputted from the external terminals I/01 and I/02 respectively pass through signal lines in a horizontal wiring area HLA1 to signal lines in a vertical wiring area VLA2 and are supplied to their corresponding programmable logic cells LCL1 and LCL2. Each output signal of the programmable logic cell LCL1 passes through the corresponding signal line in the vertical wiring area VLA2, the corresponding signals lines in the horizontal wiring area HLA2 and vertical wiring area VLA3 and the corresponding signal line in a horizontal wiring area HLA3 and is outputted from the external terminal I/04. Further, each output signal of the programmable logic cell LCL2 passes through the corresponding signal line (a signal line different from the signal line outputted from LCL1) in the vertical wiring area VLA2 to the corresponding signal line in a horizontal wiring area HLA4 and is outputted from the external terminal I/06.

Figure 10:
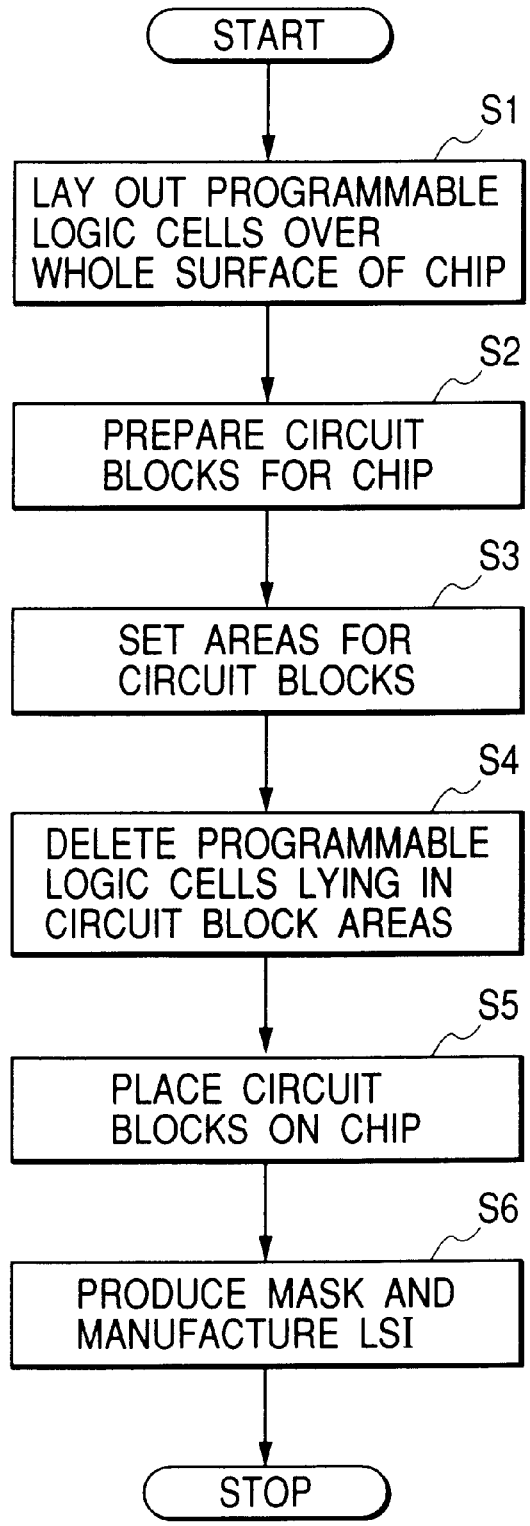
FIG. 10 is a flowchart showing a procedure from the design of a semiconductor integrated circuit having an FPLA over which programmable logic circuits are spread, to its manufacture.

A procedure of designing, inspecting and manufacturing a system LSI according to the present invention will next be explained using flowcharts shown in FIGS. 10 and 11.

Figure 12:
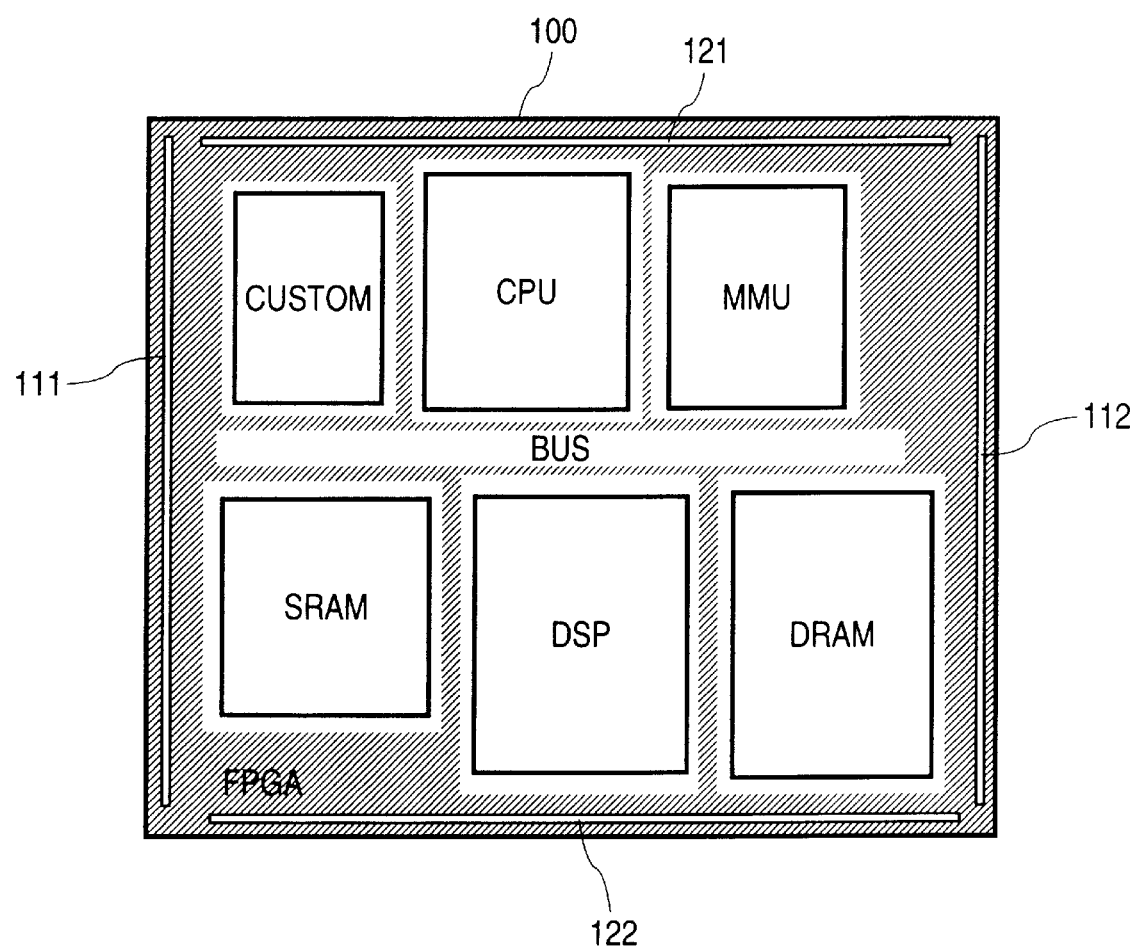
FIG. 12 is a layout diagram showing one example of the layout of respective circuit blocks on a semiconductor chip at the time that the present invention is applied to a system LSI.

Upon design of the system LSI according to the present invention, the programmable logic cells LCL each employed in the above embodiment are first spread over a semiconductor chip with no space therebetween according to a design support tool such as a DA program or the like. As shown in FIG. 12, a full-face or whole FPGA is formed wherein decoder circuits 111 and 112 (each corresponding to DEC shown in FIG. 6) for respectively selecting memory cells in each programmable logic cell and sense amplifier sequences 121 and 122 (each corresponding to AMP shown in FIG. 6) for reading/writing of the selected memory cells are placed along the respective sides of a chip 100 (Step S1).

Next, circuit blocks such as macro cells such as a central processing unit CPU, a read-only memory ROM, a static memory SRAM, a dynamic memory DRAM, a memory management unit MMU, a digital signal processor DSP, etc. which constitute the system LSI; a custom logic circuit (user logic) CUSTOM having a function desired by a user; etc. are prepared (Step S2). In consideration of the forms and sizes of these circuit blocks, the placement of a bus BUS for connecting between these circuit blocks, etc., the layout of the circuit blocks on the semiconductor chip is determined as shown in FIG. 12 by way of example (Step S3).

Figure 13:
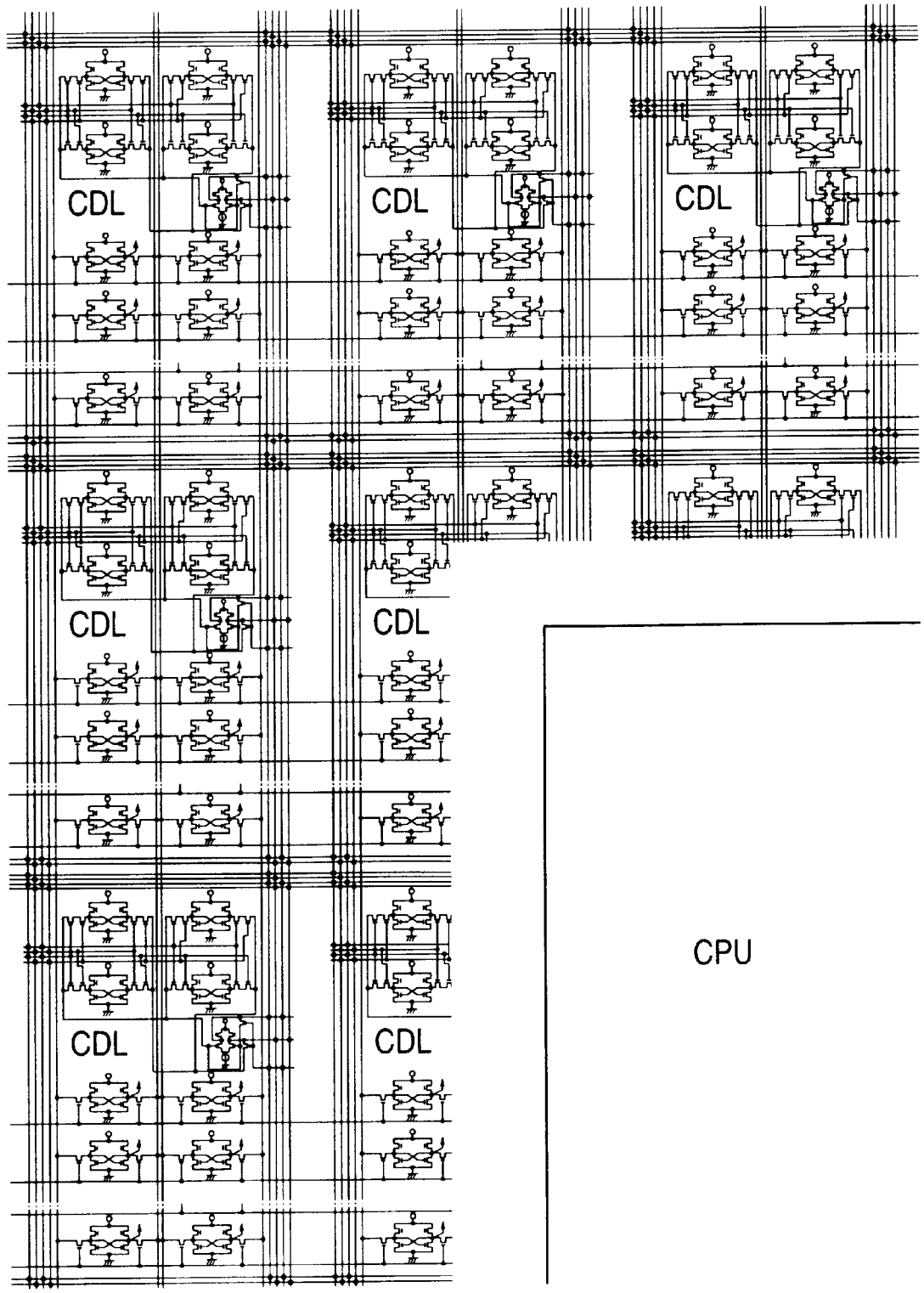
FIG. 13 is a layout diagram illustrating the manner in which circuit blocks are laid out within an FPLA over which programmable logic circuits are spread.

Of the programmable logic cells constituting the full-face FPGA placed in Step S1, the programmable logic cells lying in areas superimposed on layout positions of the circuit blocks determined in Step S3 are next deleted (Step S4). Then, the circuit blocks to be laid out in their deleted areas are placed in the corresponding areas, and signal lines and power or source lines for connecting between the circuit blocks are designed (Step S5). Incidentally, if the FPGA is cut off on the border between the programmable logic cells at this time, it may be left as it is. However, when the FPGA is cut off in the course of the programmable logic cells and an effectively-nonfunctional element occurs as shown in FIG. 13, a terminating process such as the disconnection of such an element from source and ground lines connected thereto may preferably be executed. This terminating process can be carried out by eliminating wiring data used for connecting an unnecessary element and the source line or the like from layout design data, for example.

Thereafter, a mask is produced based on design data, and the system LSI is formed on a wafer according to a manufacturing process through the use of the created mask (Step S6). Incidentally, FIG. 13 shows the manner in which some of cells are cut away due to the superimposition of a circuit block on part of cells. However, when such a case takes place, the whole cells whose parts have been cut away, may be deleted.

Figure 11:
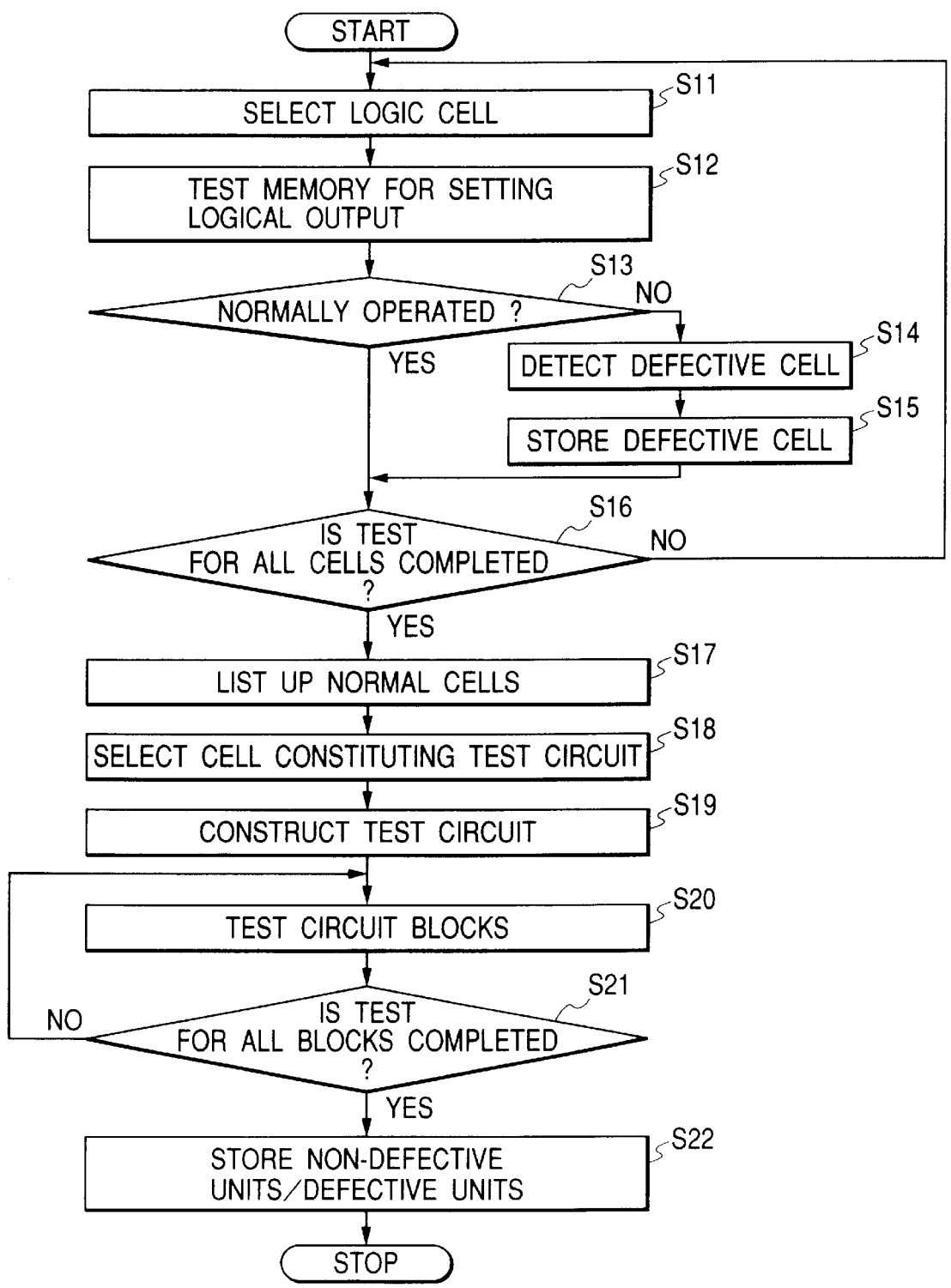
FIG. 11 is a flowchart illustrating a method of testing each programmable logic circuit constituting an FPLA and circuit blocks.

If the system LSI is fabricated in the above-described manner, then a test on whether the respective circuit blocks normally operate, is carried out according to the flowchart shown in FIG. 11. Incidentally, the preset test is performed through a probe test in a wafer state.

Figure 14:
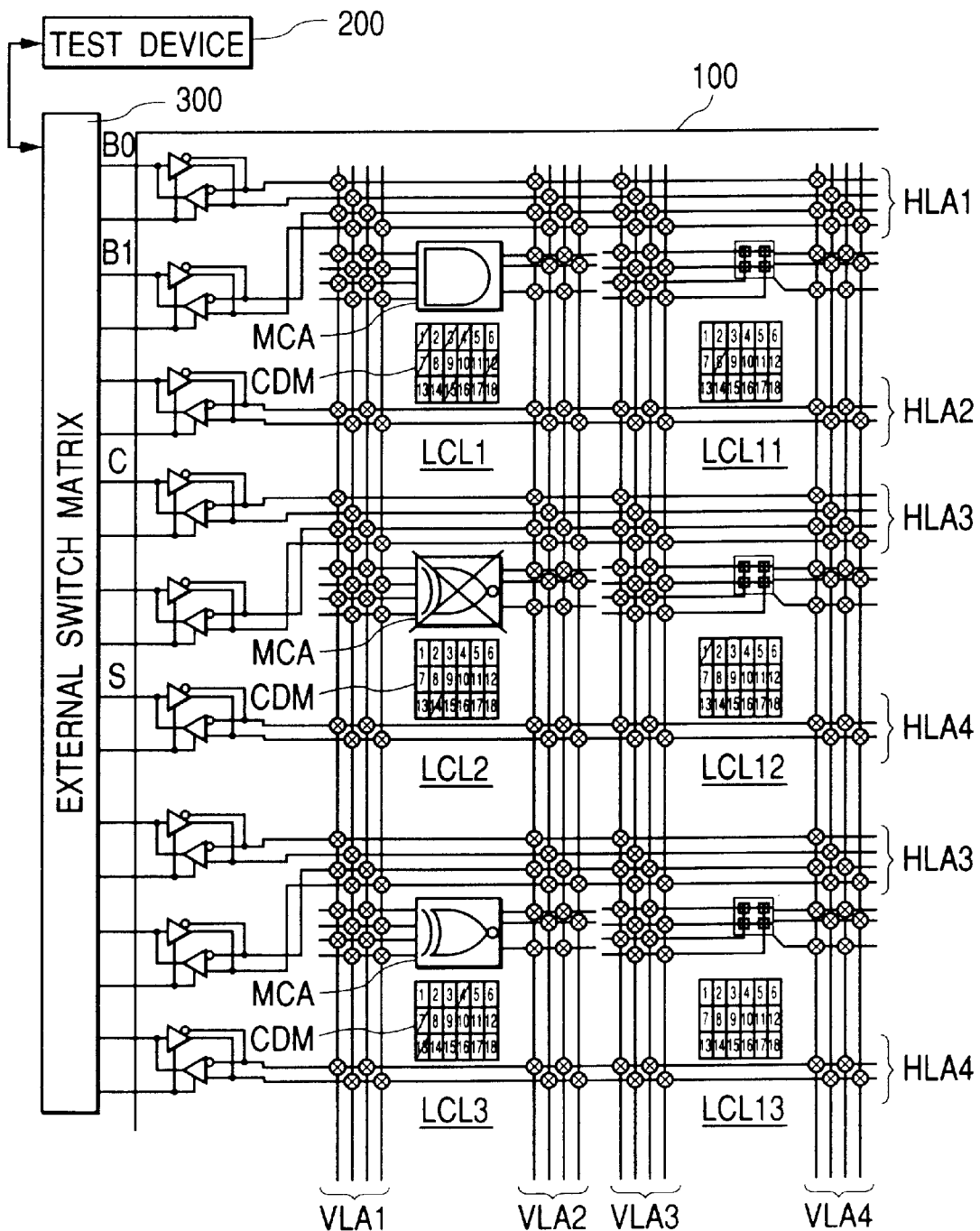
FIG. 14 is an explanatory diagram showing a method of reconstructing a logic circuit corresponding to FIG. 8 where a defective logic cell is detected by testing on an FPLA configured using the programmable logic circuits employed in the embodiments.

Upon the wafer test, each of a test device for testing each FPLA portion or unit left in a space defined between the respective circuit blocks and therearound, and a logic combination and writing device is first made up of an external device. Here, a normally-used personal computer or the like is used as the external device which constitutes each of the test device and the logic combination and writing device. Incidentally, a test device and an FPLA portion or unit to be checked or examined may preferably be connected to each other through a switch matrix 300 which allows the connection of an arbitrary external terminal of a chip 100 to a signal input/output terminal of a test device 200 as shown in FIG. 14.

If the above preparation is terminated, then a program for the test device is started up to start a process of FIG. 11. In doing so, the test device first forms a control signal for the switch matrix 300 and sets so that a desired signal can be inputted to and outputted from a desired terminal. Further, the test device inputs an address signal for designating or specifying the corresponding programmable logic cell to a decoder lying in the chip to thereby bring one programmable logic cell to a selected state. Further, the test device writes connection information into each memory cell in a wiring connection information storage circuit CDM lying in the corresponding programmable logic cell to thereby bring a programmable logic portion of one programmable logic cell lying in the FPGA to its corresponding external terminal (Step S11).

Next, the operation of sending four-bit test data from the test device to logic setting memory cells MC1 through MC4 lying in the programmable logic cell placed in the selected state, writing the data therein, reading them therefrom and comparing them with expected values is repeatedly performed while patterns for the test data are being changed, whereby it is determined whether they are normally operated (Steps S12 and S13). If the operation is found not to be normal, then each defective logic cell is specified from the result of test and stored in the test device (Steps S14 and S15). If the programmable logic cell made nonexistent according to the area deletion in Step S4 of FIG. 10 exists, such a cell can be recognized. Therefore, such a nonexistent logic cell is also stored in the test device. As to the test on the programmable logic cells, the load on the test device is extremely low and the use of an expensive tester is unnecessary because test patterns related to respective cells to be tested are reduced in size as the number of the cells to be tested simply increases.

Incidentally, the defective logic cells detected in Steps S12 and S13 also include those having defects developed in switch elements SW placed at signal-line intersections, each of which allows the transfer of a signal to a logic unit to be tested, and memory cells lying in each wiring connection information storage circuit CDM for storing on/off states of the switch elements SW, as well as the logic setting memory cells MC1 through MC4 in which the test data are written. This is because if the switch elements are broken and the memory cells lying in the wiring connection information storage circuit CDM are defective even if the logic setting memory cells MC1 through MC4 are normal, then the written data cannot be read, thus making it possible to grasp the presence of defects. Based on a contrivance for each test pattern, detection is made as to in which element or signal path in the defective logic cell a defect exists. Afterwards, the defective element or path may be stored.

When no defective logic cell appears and after each defective logic cell has been stored, the routine procedure proceeds to Step S16 where it is determined whether the test on all the programmable logic cells in the remaining FPGA has been completed. If the test is found not to be finished, then the routine procedure returns to Step S11 where the above processing is repeated.

On the other hand, when it is determined in Step S16 that the test on all the programmable logic cells has been finished, the routine procedure proceeds to Step S17 where the normal programmable logic cells are listed up. The corresponding programmable logic cell used to constitute a test circuit, of the listed-up programmable logic cells is next selected (Step S18).

Next, a test circuit for testing programmable logic cells in each circuit block is constructed in a set area (Step S19). Described specifically, predetermined data are respectively written into the corresponding logic setting memory arrays lying in the programmable logic cells each employed in the above embodiment to thereby constitute logic gates necessary to constitute the test circuit. Further, wiring-to-wiring connection information used for connecting between the so-constructed logic circuit gates each having a predetermine logic function is produced and written into the corresponding memory circuit CDM lying in the logic unit, whereby the corresponding test circuit is constructed. When, at this time, the defect is found out programmable logic cell LCL2 as shown in FIG. 14 where for example, such a half adder as shown in FIG. 9 is configured, it is eliminated and programmable logic cell LCL3, for example, is used as an alternative to it to thereby constitute an EOR gate circuit.

The test circuit constructed in the FPLA unit comprises a microinstruction type controller, a data arithmetic unit, data determining means for determining read data and outputting the result of its determination, etc. Further, the test circuit can be implemented by applying a test technology called "ALPG (Algorithmic memory Pattern Generator)" for generating a test pattern in accordance with a predetermined algorithm and reading written data.

If a test circuit for each in-chip circuit block is constructed in the FPLA already checked in the above-described manner, then the corresponding test circuit is used to examine each of individual circuit blocks on the chip (Step S20). It is determined whether the tests on all the circuit blocks have been finished (Step S21). If they are normally operated after their completion, then they are stored as non-defective units. If even any of the circuit blocks is found out as a normally non-operated circuit block, it is stored as a defective unit (Step S22). Incidentally, the test circuit can also be constructed as a test circuit common to all the circuit blocks in the chip. However, test circuits each based on the optimum algorithm may respectively be reconstructed for every of the circuit blocks so as to perform their testing. The supply of test signals from the test circuit to each of individual circuit blocks may make use of those obtained by extending the wirings in the wiring areas VLA1, VLA2, HLA1 and HLA2 constituting the programmable logic cell in FIG. 4. Alternatively, the wirings in the wiring areas VLA1, VLA2, HLA1 and HLA2 may be connected to signal lines constituting a system's bus so that the signals are supplied via the bus.

Further, the test circuit may be left as it is after the completion of the tests. Alternatively, logic storage constitutive of the test circuit may be deleted from storage elements lying in each programmable logic cell. As an alternative to it, the FPGA unit in which the test circuit has been constructed, may be reconstructed as an SRAM so that each circuit block (e.g., CPU) on the chip can be used as a working area or a memory area, or it can also be used as a logic circuit constituting part of user logic. If a defect is found in part of any circuit block by the above testing, then a circuit for mending or repairing its defect may be configured in the FPGA unit. In this case, the programmable logic cell having constituted the test circuit is used to rewrite its logic storage and connection information, whereby a repairing circuit may be configured. Alternatively, the defect may be repaired by use of the programmable logic cell unused for the configuration of the test circuit. In either case, a programmable logic cell placed in a location near a defective place may preferably be used.

Figure 15:
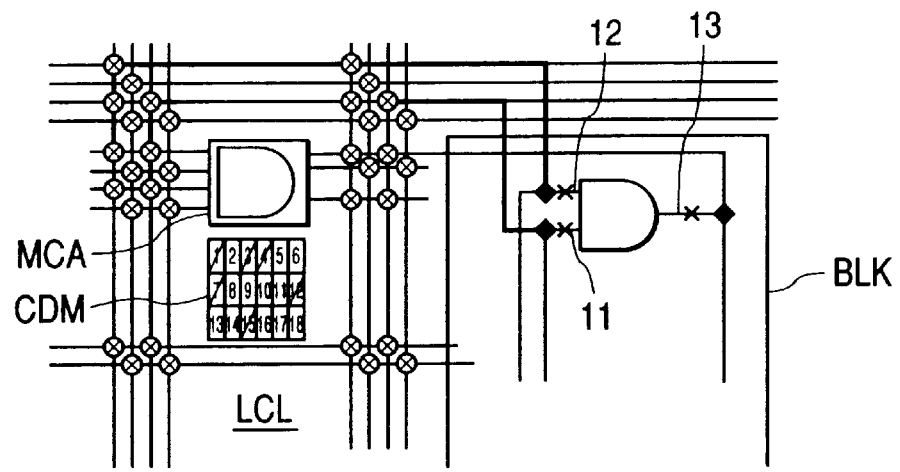
FIG. 15 is a circuit configurational diagram schematically illustrating the mending or repairing of an AND gate constituting a circuit block by its replacement with an AND gate formed in a programmable logic cell LCL.

FIG. 15 schematically shows, as one example, the manner of the execution of defect repairing by replacement of an AND gate constituting a circuit block with an AND gate configured in a programmable logic cell LCL. In this case, such points as indicated by x marks in the drawing, on the original signal lines 11, 12 and 13 connected to an AND gate lying in a circuit block BLK are cut off by laser, and ones indicated by heavy lines, of wirings provided for connections between programmable logic cells are used. Further, laser or the like is applied to points (corresponding to points marked with ◆ in the drawing) where the wirings and the original signal lines intersect, thereby to short-circuit between the upper and lower wirings so as to form detour or bypass paths, whereby the circuit can be replaced with another.

According to the method according to the embodiment, when the defective logic cell is detected in the FPGA unit, the test circuit is made up of only the normal logic cells except for the defective logic cell. It is therefore possible to prevent a reduction in product yield due to a failure in the test circuit itself as in the case where a dedicated test circuit is incorporated like BIST. After the completion of the testing, the FPGA unit can be used as the SRAM to reduce overhead. Since the wiring connection information storage unit or memory CDM of each programmable logic cell has substantially the same configuration as the SRAM in the embodiment shown in FIG. 5 in particular, a change in SRAM is extremely easy. Further, an advantage is obtained in that if the FPGA unit is used as for the formation of the repairing circuit at the time that the defect is found out in the circuit block, yields are improved.

A peripheral technology effective upon implementing the present invention and the above-described embodiment will next be described.

Figure 16:
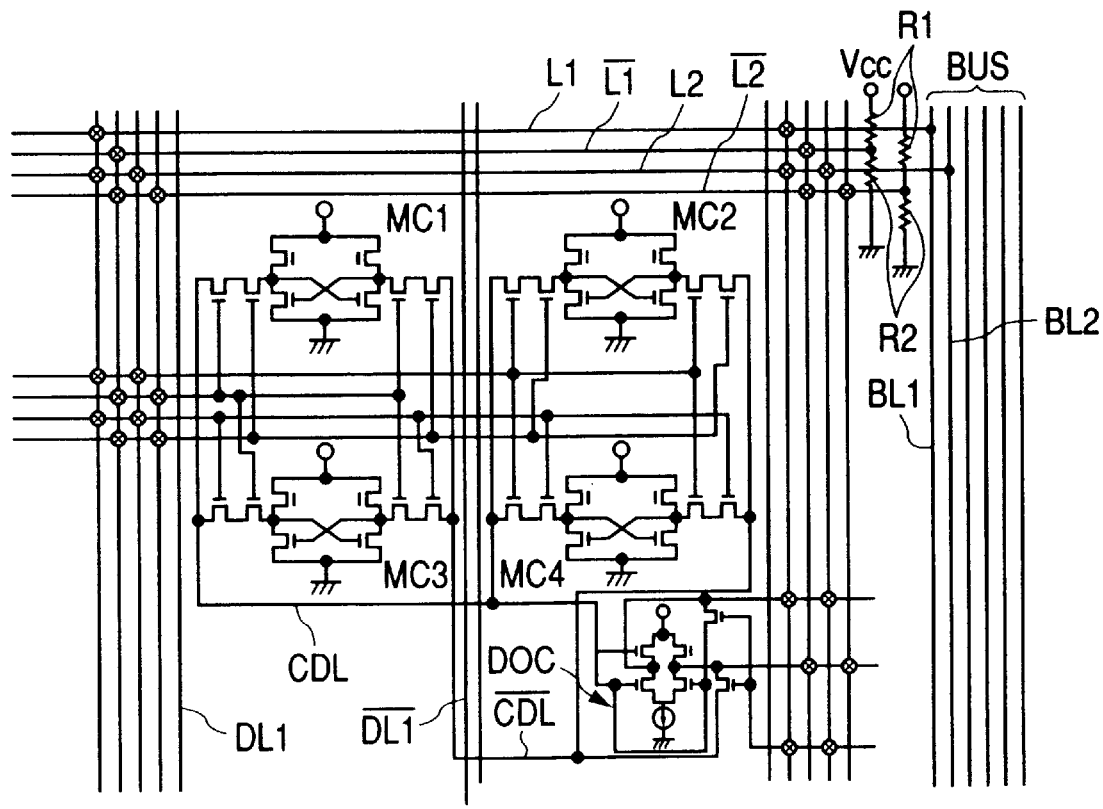
FIG. 16 is a circuit diagram showing one example of connections between a programmable logic circuit and a bus at the time that the present invention is applied to a system LSI.

FIG. 16 shows one example of the way of specifically connecting signal lines for each programmable logic cell and signal lines for a bus where the programmable logic cell performs the input/output of the signals in differential form as in the above embodiment, and the programmable logic cell is configured so as to be capable of transmitting and receiving signals to and from each circuit block on a chip when a general bus of a one-signal and one-signal line type is used without using the differential mode.

As shown in FIG. 16, one signal lines L1 and L2 of differential signal lines L1, /L1 ($\overline{L1}$) and L2, /L2 ($\overline{L2}$), which extend and are connected from a programmable logic cell LCL, are connected to their corresponding signal lines BL1 and BL2 of signals lines constituting a bus BUS, whereas the other signal lines /L1 and /L2 respectively have ends to which resistance type voltage dividers each comprising resistors R1 and R2 series-connected between a source voltage Vcc and a ground point are respectively connected. An intermediate potential between high and low levels of signals transferred from the signal lines L1 and L2 is applied to each of the other signal lines. This is done to allow a programmable logic circuit for bringing one of differential signals to an intermediate level to thereby receive a signal therein to accurately detect a level when the signal is transferred from the circuit block side to the test circuit side. Incidentally, the resistors R1 and R2, which each constitute a resistance type potential divider, are respectively set to high resistances for the purpose of reducing current consumption. The resistance type voltage dividers may be shared between the signal lines /L1 and /L2. Further, differential amplifiers are provided in place of the resistance type voltage dividers and may be configured so that one input terminals are connected to the signals lines for the bus and the other input terminals are supplied with a comparison voltage.

Figure 17:
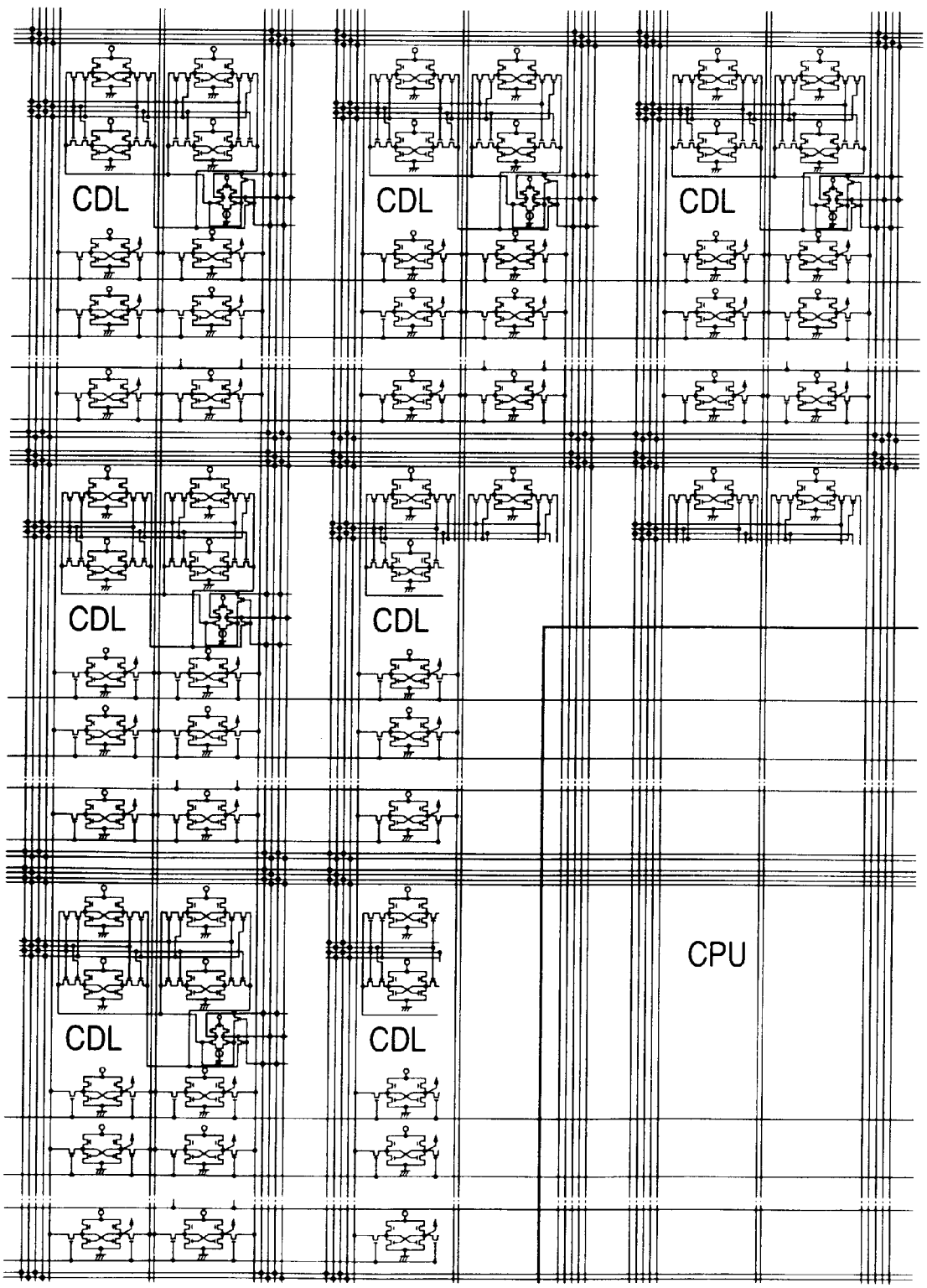
FIG. 17 is a circuit diagram depicting one example of a method for forming wirings for connecting between programmable logic circuits at the time that the present invention is applied to the system LSI.
Figure 18:
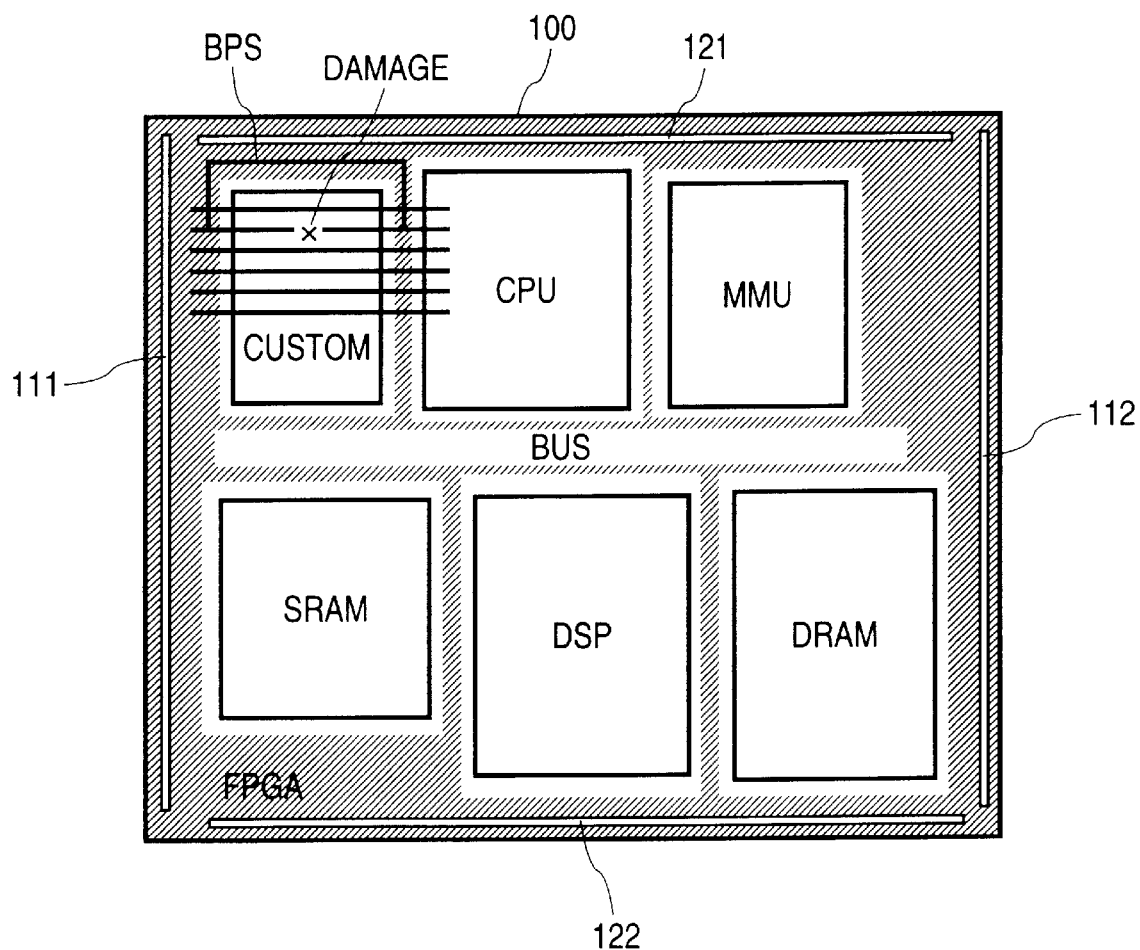
FIG. 18 is a layout diagram showing one example of connections between a test circuit comprising programmable logic circuits employed in the system LSI to which the present invention is applied, and circuit blocks used as tested circuits.

FIGS. 17 and 18 respectively show a specific example illustrative of wirings provided in an FPGA unit. As described above, the programmable logic cells constituting the FPGA unit are respectively provided with variable wiring means for allowing the connections between arbitrary signal lines. As to the programmable logic circuit VLC, the signals can externally be inputted and outputted even to and from the programmable logic cells placed in any locations on the chip. However, the select signals lines (corresponding to SL1 through SL9 in FIG. 5) for the memory cells constituting the wiring connection information storage circuit or memory CDM, and the data input/output lines (corresponding to DL1, /DL1; DL2, /DL2, etc. in FIG. 5) are partitioned or cut due to the placement of the circuit blocks on the chip, thus causing each programmable logic cell to which no signals are transferred. When a test circuit for each in-chip circuit block is configured using a relatively wide excess area at the lower-left corner where the circuit blocks are placed on the semiconductor chip as shown in FIG. 12 by way of example, it is easy to supply a test signal to each adjacent circuit block such as DSP. However, it is difficult to supply a test signal to the circuit blocks such as DRAM, MMU, etc., which are at locations distant therefrom. Similarly, even when the programmable logic cell located in the excess portion is used to constitute part of the user logic after the completion of testing, the transfer of signals between the constituted circuit and other circuit blocks becomes difficult.

Therefore, the signal lines provided so as to extend over the plurality of programmable logic cells LCL have been configured by use of wiring layers added separately from the signal lines for the circuit blocks. Described specifically, when the wirings such as the signal lines and source lines for the circuit blocks such as CPU, DSP, etc. are formed by metal layers corresponding to six layers, the signal lines provided so as to extend over the plurality of programmable logic cells LCL are formed by the metal layers corresponding to the seventh and eighth layers.

As to the source lines provided in the plurality of programmable logic cells LCL, no problem arises even if the programmable logic cells distant from one another are divided by the circuit blocks, and the source lines are connected to each other between the programmable logic cells and the circuit blocks in this state. Therefore, they can be formed of the same metal layer as the source lines for the circuit blocks. Since the signal lines (corresponding to CDL, /CDL, etc. in FIG. 5) lying in the programmable logic cells LCL are not directly connected to elements located outside the cells, they can be formed of the same metal layer (normally corresponding to the first layer) as wirings for connecting between elements in circuits such as a logic gate, a flip-flop, etc. which constitute each circuit block.

Thus, the programmable logic cells existent between the circuit blocks can also be used effectively as cells to which signals are transferred to constitute a test circuit or user logic. It is also easy to supply a test signal to each circuit block placed at a location distant from the test circuit. The incorporation of a test function in a chip and the speed-up thereof are allowed. Further, when the wirings between the programmable logic cells extending over the circuit blocks are broken, a bypass path BPS can easily be formed by making use of the variable wiring means for each programmable logic cell as shown in FIG. 18 by way of example. Therefore, a process inexpensive but relatively low in reliability, which is called "PIQ (polyimide insulating film)", for example, is used as each of the signal lines placed so as to extend over the plurality of programmable logic cells LCL, whereby an increase in cost with the addition of a wiring layer can also be reduced. Incidentally, the formation of the bypass path can be implemented by making use of switches for programmable logic cells placed below wirings for connecting between the programmable logic cells, and below the broken wiring and the turning points of the bypass path, and memory cells for storing its wiring connection information.

Figure 19:
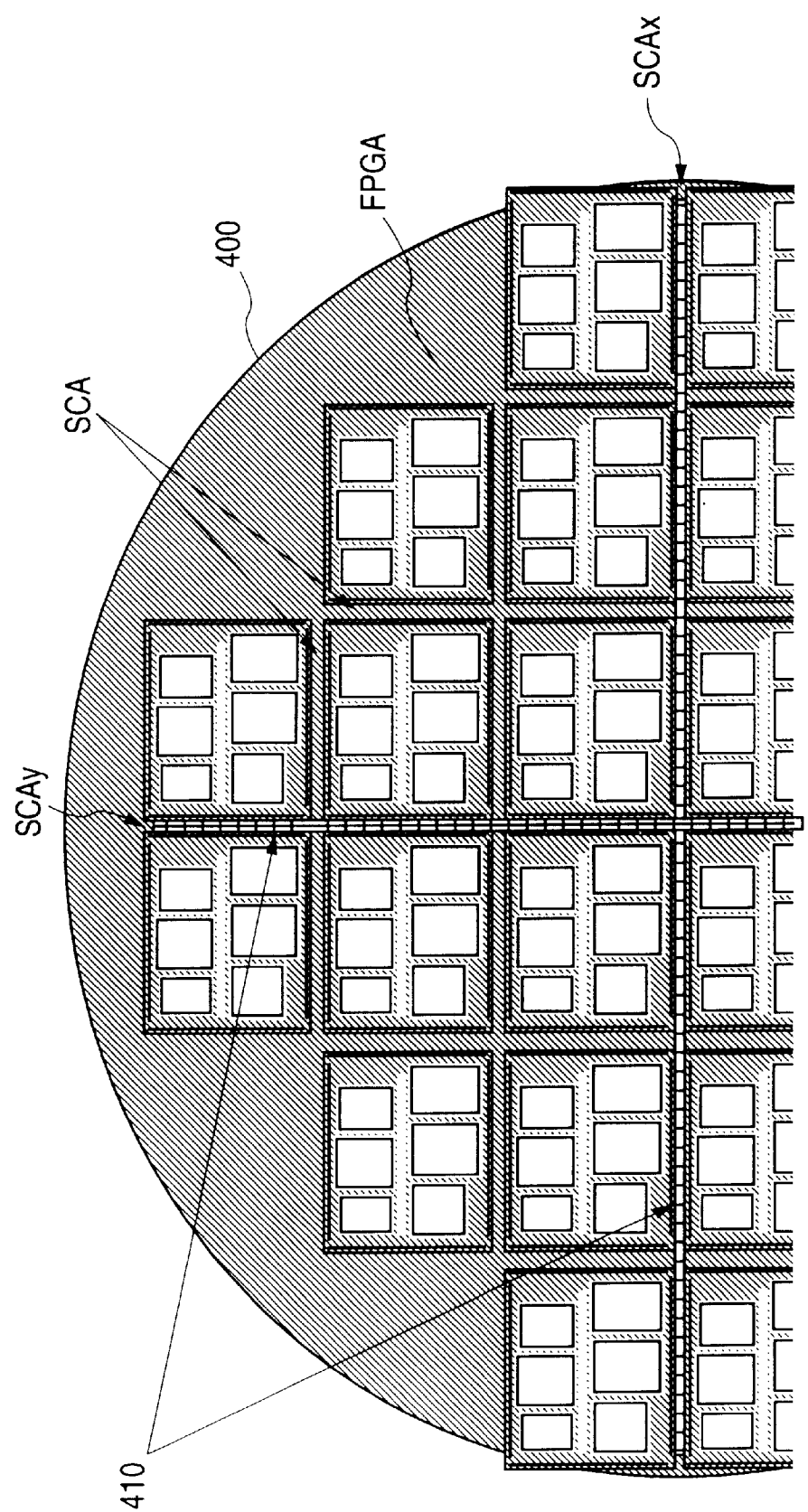
FIG. 19 is a layout diagram illustrating an embodiment at the time that the present invention is applied to a wafer.

FIG. 19 shows another embodiment of the present invention. While the above embodiment has shown the case in which the programmable logic cell corresponding to the portion excluding the areas for the circuit blocks, of the programmable logic cells spread over and placed in one LSI chip is used to constitute the test circuit, and the tests on the circuit blocks inside the chip are carried out, programmable logic cells are spread over the entire wafer in the embodiment shown in FIG. 19. Namely, the present embodiment is one wherein the programmable logic cells are spread even over scribe areas SCA each of which serves as the border between respective LSIs, and a test circuit is configured by use of the programmable logic cells excluding the programmable logic cells existent in locations where circuit blocks are laid out and performs testing.

While the above-described embodiment is configured in such a manner that the input/output of the signals to and from the test circuit through the pads provided in the respective LSIs is performed, no particular limitation is imposed to the present embodiment. The present embodiment is configured so that pad sequences 410 connected to the programmable logic cells are provided in their corresponding scribe areas SCAx and SCAy each passing through substantially the center of a wafer 400 to thereby perform the input/output of signals to and from the test circuit comprised of the programmable logic cells.

Thus, it is not necessary to provide the pads for performing the input/output of the signals from the respective LSIs to the test circuit. Further, the number of the pads for each individual chips can be reduced and each chip can be reduced in size. The respective LSIs or the circuit blocks constituting the same can be tested according to a burn-in process in a wafer state, and the time required to examine and test the LSIs inclusive of an acceleration test can greatly be shortened. Further, if testing pads are provided every chips, then the total number of pads results in a vast number when one attempts to make a test in the wafer state. It is difficult to cause a probe extending from a tester to contact all the testing pads. However, the test signals are supplied from the common pads provided in scribe lines to the respective chips as described in the present embodiment. Thus, the number of the testing pads in the whole wafer can greatly be reduced and a test in a wafer state becomes easy.

In the embodiment of FIG. 19 which allows tests in a wafer level, decoders 111 and 112 and sense amplifier sequences 121 and 122 provided every of the LSIs can be provided in the scribe areas SCAx and SCAy in a manner similar to the testing pads. In the embodiment shown in FIG. 19 as well, a test circuit configured using programmable logic cells lying in an excess area may be provided for each LSI, or one test circuit may be provided with respect to the whole wafer. Alternatively, the test circuits may respectively be configured in sectorial areas divided by the scribe areas SCAx and SCAy as shown in FIG. 19 so as to perform testing. Further, test circuits for all the circuit blocks on a chip may distributively be configured on a wafer so as to examine the circuit blocks as in the case where a test circuit for CPU is provided at one portion on the wafer and a test circuit for a DSP is provided at the other portion thereof.

While the invention made by the present inventors has been described above specifically by the embodiments, the present invention is not limited to the embodiments. It is needless to say that various changes can be made thereto within the scope not departing from the substance thereof. While each of the above-described embodiments has shown the case in which the test circuit for examining the in-chip circuit blocks is configured in the FPGA unit comprising the programmable logic cells spread over the areas other than the circuit blocks, for example, a test circuit for examining programmable logic cells in another FPGA unit can also be constructed in part of the FPGA unit except for the above configuration so as to perform their testing itself.

The use of a FPGA unit provided in a free area of an LSI makes it possible to take out a signal at an arbitrary place of a chip to the outside of the chip and input it therein. Thus, upon execution of a failure analysis for detecting a faulty point in a defective LSI and emulation for debugging a program developed by a user, the function of facilitating emulation can also be implemented as in the case of a trace circuit for sampling and holding signals on a bus through the use of each programmable logic cell constitutive of a test circuit, a monitor circuit for allowing the external monitoring of a desired internal signal, etc.

While the above description has principally been made of the case in which the invention made by the present inventors is applied to the system LSI, the method of designing it and the method of manufacturing it, which belong to the field of application corresponding to the background of the invention, the present invention is not limited to them. The present invention can generally be applied to a logical integrated circuit. The present invention is effective for application to a semiconductor integrated circuit designed by a CBIC system in particular.

Advantageous effects obtained by a typical one of the inventions disclosed in the present application will be described in brief as follows:

According to the present invention, a self-examining test circuit can be configured without an increase in chip size. An internal circuit can be examined or checked without having to use an expensive tester. It is also possible to avoid a reduction in yield due to the occurrence of a failure in a test circuit itself.

What is claimed is:

1. A method of designing a semiconductor integrated circuit, comprising the steps of:

laying out a plurality of programmable logic cells each having storage elements and each capable for outputting an arbitrary logic output corresponding to an input according to information stored in each storage element so as to spread over an entire semiconductor chip;

thereafter determining a layout of circuit blocks each having a desired function; and laying out each of said circuit blocks in a layout-determined area on the semiconductor chip by deleting said programmable logic cells in said layout-determined area and placing said circuit blocks there into.

2. A method of manufacturing a semiconductor integrated circuit, comprising the steps of:

laying out a plurality of programmable logic cells each having storage elements and each capable of outputting an arbitrary logic output corresponding to an input according to information stored in each storage element so as to spread over the entire semiconductor chip;

thereafter determining a layout of circuit blocks each having a desired function;

laying out each of said circuit blocks in a layout-determined area on the semiconductor chip by deleting said programmable logic cells in said layout-determined area and placing said circuit blocks there into thereby form the semiconductior integrated circuit;

thereafter forming a test circuit for examining said programmable logic cells and checking at least one of said circuit blocks through the use of a programmable logic cell judged to be normal; and examining each circuit block by said test circuit to thereby remove a defective product.

3. The method according to claim 2, wherein after the examination of the circuit blocks by said test circuit configured by the programmable logic cell has been completed, a semiconductor integrated circuit which is judged to be defective on the basis of the result of examination is removed, and the programmable logic cell having constituted said test circuit constitutes a logic circuit having a desired function.

4. The method according to claim 2, wherein after the examination of the circuit blocks by said test circuit configured by the programmable logic cell has been finished, a portion having a defect detected by said examination is repaired by the programmable logic cell having constituted said test circuit or by another programmable logic cell.

* * * * *